United States Patent [19]
Fukutani et al.

[11] Patent Number: 6,038,431
[45] Date of Patent: *Mar. 14, 2000

[54] CARD-TYPE ELECTRONIC DEVICE FOR ADDING A DATA COMMUNICATION FUNCTION TO AN APPARATUS WITHOUT HARDWARE MODIFICATION OF THE APPARATUS

[75] Inventors: Junichi Fukutani, Ichinomiya; Yuichi Watanabe, Gifu-ken, both of Japan

[73] Assignee: Matsushita Electric Industrial Co., Ltd, Osaka, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/400,951

[22] Filed: Mar. 8, 1995

[30] Foreign Application Priority Data

Mar. 14, 1994 [JP] Japan ................................... 6-042525
Mar. 24, 1994 [JP] Japan ................................... 6-053955

[51] Int. Cl.⁷ ....................................................... H04B 1/38
[52] U.S. Cl. ............................ 455/90; 455/128; 455/344; 455/348; 455/351; 455/310; 375/327; 375/316
[58] Field of Search ................................. 455/89, 90, 66, 455/45, 128, 344, 347, 348, 349, 351, 103, 260, 295, 300, 301, 310, 311, 312; 348/552; 395/200; 375/327, 324, 329, 344, 345, 316; 343/877

[56] References Cited

U.S. PATENT DOCUMENTS

| | | |
|---|---|---|
| 4,117,495 | 9/1978 | Hochstein ................................ 343/877 |
| 5,058,138 | 10/1991 | Figura et al. . |
| 5,170,487 | 12/1992 | Peek ........................................... 455/45 |
| 5,265,265 | 11/1993 | Hama et al. ............................. 455/300 |
| 5,271,039 | 12/1993 | Suzuki . |
| 5,325,401 | 6/1994 | Halik et al. ............................... 375/329 |
| 5,357,091 | 10/1994 | Ozawa et al. ....................... 395/200 X |
| 5,359,367 | 10/1994 | Stockill .................................... 348/552 |
| 5,361,061 | 11/1994 | Mays et al. ............................. 455/348 |
| 5,410,749 | 4/1995 | Siwiak et al. ....................... 455/351 X |
| 5,430,890 | 7/1995 | Vogt et al. ........................... 455/260 X |
| 5,521,943 | 5/1996 | Dambacher ......................... 455/103 X |

FOREIGN PATENT DOCUMENTS

| | | |
|---|---|---|
| 514133A | 1/1993 | Japan . |
| 5102864A | 4/1993 | Japan . |
| 9105436 | 4/1991 | WIPO . |

OTHER PUBLICATIONS

Patent abstracts of Japan, vol. 17, No. 518 (E–1434) Sep. 17, 1993 & JP–A–05 136655 (Murata Mfg Co Ltd) Jun. 1, 1993.

Radio Fernsehen Elektronik, vol. 39, No. 10, Oct. 1990, Berlin, DE, pp. 686–688, "Das ELV–PC–Radio; Teil 1" & Teil 2, vol. 39, No. 11, Nov. 90, pp. 757–759; Teil 3, vol. 39, No. 12, Dec. 90, pp. 816–819.

Behr, "Für Sofa–Potatoes", C'T, Magazin für Computertechnik, No. 12–Dec. 1993, Hannover, DE, pp. 126–132.

*Primary Examiner*—Wellington Chin
*Assistant Examiner*—Philip J. Sobutka
*Attorney, Agent, or Firm*—Stevens, Davis, Miller & Mosher, L.L.P.

[57] ABSTRACT

In a card-type electronic tuner, a digital broadcasting is received without need of hardware reconstruction of a personal computer used for the digital broadcasting reception. The electronic tuner includes a signal input terminal, a local oscillator, a mixer, an output terminal, a PLL circuit and a data input terminal. All of these components are packaged in a card-type case. A digital signal processor includes a digital signal extractor and/or an A/D converter and is connected between the mixer and the output terminal. The digital broadcasting is received and the data is applied directly to the personal computer. The electronic tuner in the shape of a card can be used with an expansion slot for a memory card of the personal computer and there is no need of reconstructing a hardware of the personal computer.

18 Claims, 19 Drawing Sheets

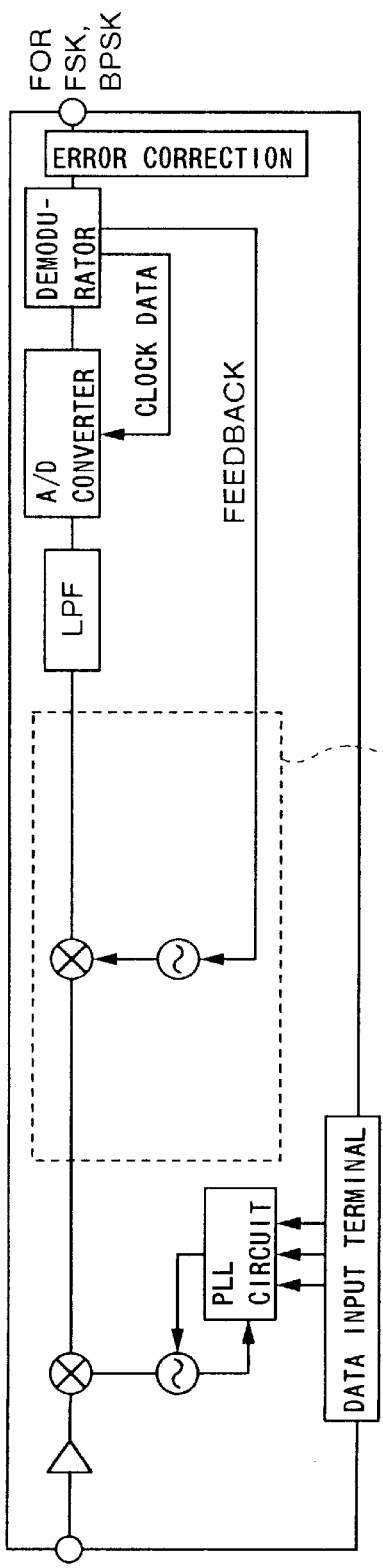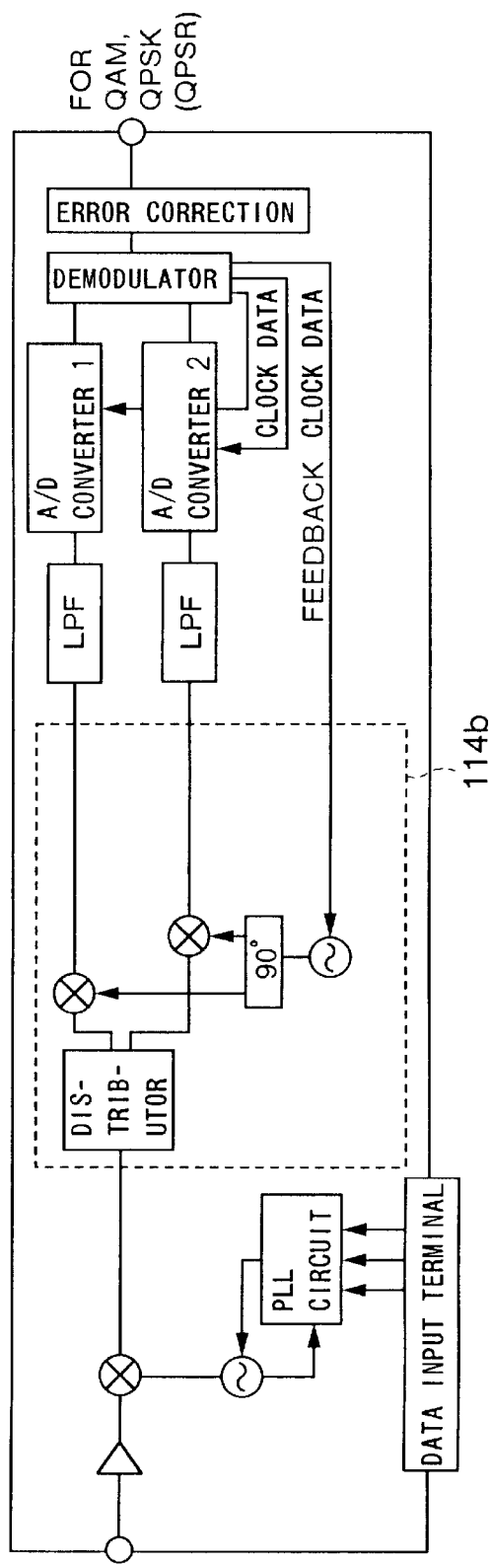

CARD-TYPE ELECTRONIC DEVICE FOR ADDING A DATA COMMUNICATION FUNCTION TO AN APPARATUS WITHOUT HARDWARE MODIFICATION OF THE APPARATUS

BACKGROUND OF THE INVENTION

1. Field of the Invention

The present invention relates to a card-type electronic tuner for receiving a digital broadcast or digital communication by means of a personal computer or the like taking advantage of a slot for a memory card used with the personal computer or the like.

2. Description of the Related Art

A conventional card-type electronic tuner will be explained with reference to the accompanying drawings. As shown in FIG. 28, the conventional card-type electronic tuner comprises a signal input terminal 1 supplied with a high-frequency signal, a mixer 3 having an input terminal thereof supplied with a signal from the signal input terminal 1 and the other input terminal supplied with an output of a local oscillator 2, an analog demodulator 4 connected with the output of the mixer 3, an output terminal 5 connected with the output of the analog demodulator 4, a PLL circuit 6 having an input connected with the output of the local oscillator 2 and having a PLL output connected to the input of the local oscillator 2, and a data input terminal 7 for supplying a data signal to the PLL circuit 6, wherein these circuits are packaged in a card-type case 8, with the high-frequency signal input terminal 1, the output terminal 5 and the data input terminal 7 provided on a lateral side of the case 8.

A card-type electronic tuner configured as described above is inserted into a personal computer or the like to perform the digital processing operation on the personal computer or to enjoy a television program by switching to the card-type electronic tuner.

A conventional apparatus relating to this technique is disclosed in JP-A-5-14133.

In this conventional configuration comprising the demodulator 4 which is dedicated to the analog broadcasting, however, the digitally-modulated broadcasting or communications (hereinafter referred to as "the broadcasting, etc.") developed in recent years cannot be received and demodulated. With the multimedia age just around the corner, this hurdle is being eliminated by the progress of the digitally-modulated broadcasting and data communications. There is a growing strong demand for receiving the digitally-modulated broadcast for performing multi-facet information processing by digital signals on a terminal, e.g., a personal computer or the like. In the process, the personal computer should preferably be reconstructed as little as possible.

SUMMARY OF THE INVENTION

Accordingly, the object of the present invention is to provide a card-type electronic tuner capable of receiving the digitally-modulated broadcast, etc. without reconstruction of hardware.

In order to achieve this object, a card-type electronic tuner according to the invention comprises a signal input terminal supplied with a high-frequency signal, a mixer having an input terminal supplied with a signal from the signal input terminal and the other input terminal supplied with an output of a local oscillator, an output terminal supplied with the output signal of the mixer, a PLL circuit having an input terminal connected with the output of the local oscillator and having a PLL signal output terminal connected to the input terminal of the local oscillator, and a data input terminal for supplying a data signal to the PLL circuit, wherein all of the aforementioned component parts are packaged in a card-type case, the output terminal and the data input terminal are provided on a lateral side of the case, and digital signal processing means including at least selected one of extraction means and an A/D converter is inserted between the mixer and the output terminal.

In this configuration wherein digital signal processing means including at least selected one of extraction means or an A/D converter is inserted between a mixer and an output terminal, the digitally-modulated broadcasting or the like data can be received and supplied directly to the personal computer or the like.

Also, the card-type electronic tuner assumes a profile of card-type case, and therefore the slot of the personal computer for memory card insertion can be used as it is, so that reconstruction of the hardware of the personal computer or the like is not required.

BRIEF DESCRIPTION OF THE DRAWINGS

FIG. 11A is a diagram for explaining single-axis extraction means.

FIG. 11B is a diagram for explaining double-axis extraction means.

DESCRIPTION OF THE PREFERRED EMBODIMENTS

An embodiment of the present invention will be described below with reference to the accompanying drawings.

[Embodiment 1]

Figure 4:
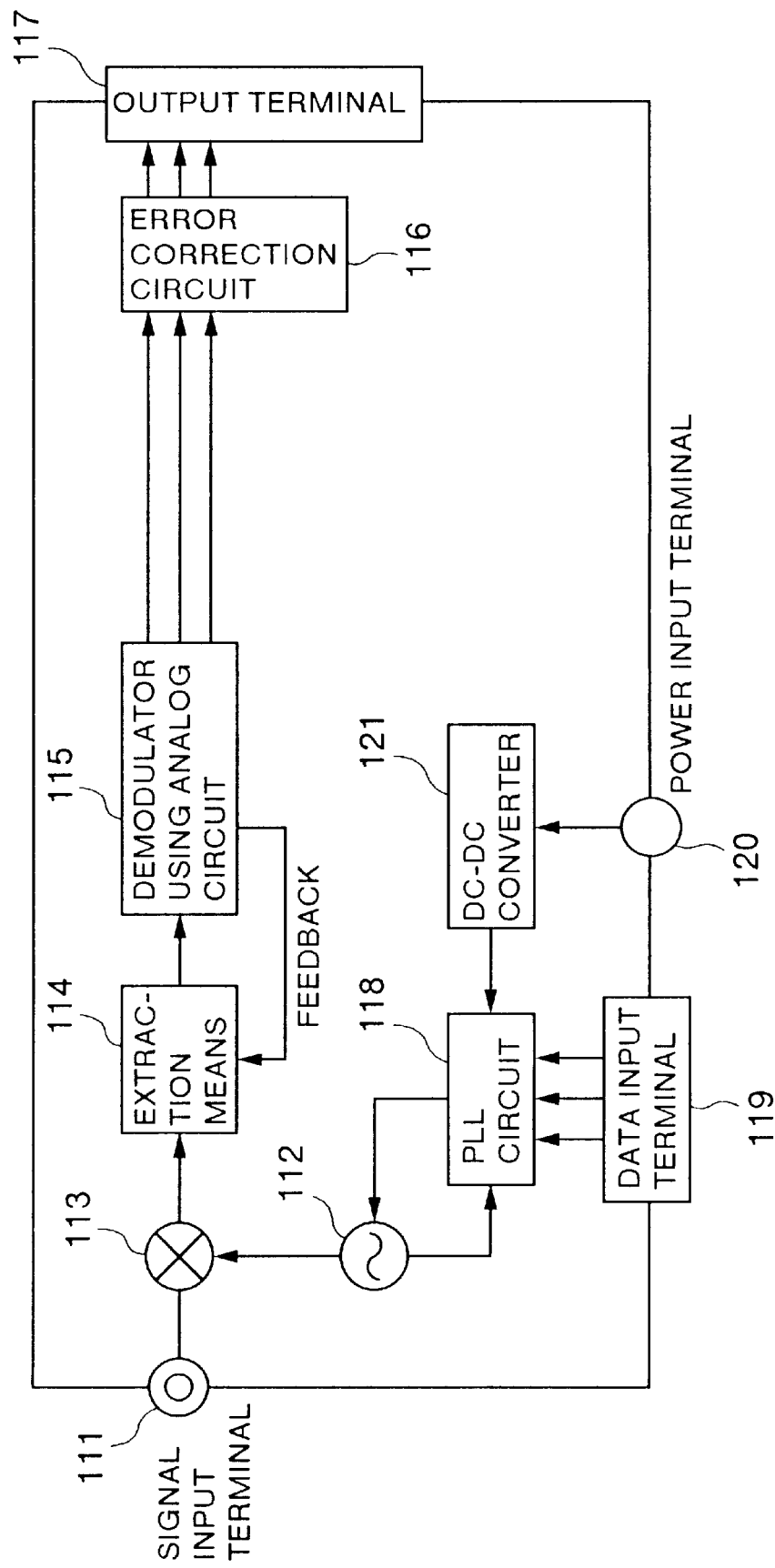
FIG. 4 is a block diagram of a card-type electronic tuner according to a first embodiment of the invention.

A first embodiment of the invention is shown in FIG. 4. In FIG. 4, an electrical circuit of a card-type electronic tuner according to the present invention comprises a signal input terminal 111 supplied with a high-frequency signal, a mixer 113 having an input terminal supplied with a signal from the signal input terminal 111 and the other input terminal connected with the output of a local oscillator 112, digital signal extraction means 114 connected with the output of the mixer 113, a low-pass filter (not shown) connected with the output of the extraction means 114, a demodulator 115 using an analog circuit connected to the low-pass filter, an error correction circuit 116 is connected with the output of the demodulator 115, an output terminal 117 connected with the output of the error correction circuit 116, a PLL circuit 118 having an input terminal connected with the output of the local oscillator 112 and a PLL signal output terminal connected to the input of the local oscillator 112, a data input terminal 119 for supplying a data signal to the PLL circuit 118, a power input terminal 120, and a DC-DC converter 121 interposed between the power input terminal 120 and the PLL circuit 118.

The operation of a card-type electronic tuner configured as described above will be explained below.

The high-frequency signal applied to the signal input terminal 111 provides an intermediate frequency signal after the tuning operation through the mixer 113 and the local oscillator 112. This intermediate frequency signal is demodulated into a digitally-processable signal form by the digital signal extraction means 114, the low-pass filter and the demodulator 115. More specifically, the broadcast signal wave that has been digitally modulated, as shown in Equation 1, is represented by a cosine wave, for example (the following explanation refers to the case using a cosine wave). Assuming that the information "0" represents a phase difference 0, the information "1" is delayed 180 degrees from the information "0". The delay of 180 degrees in phase is designated by attaching a minus sign to the cosine wave with phase difference of zero as shown in Equation 2. More specifically, the information "0" and "1" can be denoted by attaching plus and minus signs respectively to a cosine wave as shown in Equation 3.

$$0 \ldots \cos \omega t$$

$$1 \ldots \cos (\omega t+180°) \tag{1}$$

$$\cos (\omega t+180°)=-\cos \omega t \tag{2}$$

$$\pm\cos \omega t \tag{3}$$

Further, in order to increase the information amount, other information "0" and "1" may be assigned the phase differences of 90 and 270 degrees respectively. For convenience' sake, the phase differences of 0 and 180 degrees are assumed as an I signal, and the phase differences of 90 and 270 degrees as a Q signal. The coordinate axes of these signals are orthogonal to each other due to the phase differences thereof. The demodulating operation will be assumed to occur on the I axis in the following explanation.

When a digitally-modulated signal is applied to a card-type electronic tuner, as shown in Equation 4, the input signal is multiplied by a cosine wave of the same frequency as the input signal at the extraction means 114, thereby producing a cosine wave having an absolute term and a frequency twice the original frequency. The absolute term is obtained by removing the two-fold frequency through a low-pass filter in the next stage. This absolute term finally provides a demodulation signal.

$$\pm\cos \omega t \times \cos \omega t = \pm\tfrac{1}{2}(1+2 \cos 2\omega t) \tag{4}$$

The cosine wave thus supplied has some deviation in frequency and phase from the cosine wave generated in the extraction means 114. The demodulator 115 in the next stage extracts the fundamental frequency of the cosine wave by means of an analog resonator circuit. This signal is fed back to the extraction means 114 to correctly compensate for the cosine wave generated. In this way, according to this embodiment, a conventional analog circuit can be used as the demodulator 115 with a reduced cost. Also, as shown in FIG. 11, an analog local oscillator is used as the extraction means 114 and therefore a high intermediate frequency (band signal) can be input. Given a limited response rate of the feedback loop, however, the error rate increases for lack of synchronization in an area beyond the limit. In the case where the Q signal is also contained, the I and Q signals are separated and finally synthesized. As a result, the error rate unavoidably increases due to the deteriorated orthogonal accuracy between I and Q axes. Suitable applications therefore include those involving a comparatively small transmission amount (say, about 5 Kpbs) which is practicable even with a low transmission rate. Applicable products include digital portable telephones.

The signal thus demodulated is applied to the error correction circuit 116 where an error thereof is corrected. An error-corrected signal is applied from the output terminal 117 to a personal computer, in which the signal is digitally processed.

Figure 7:
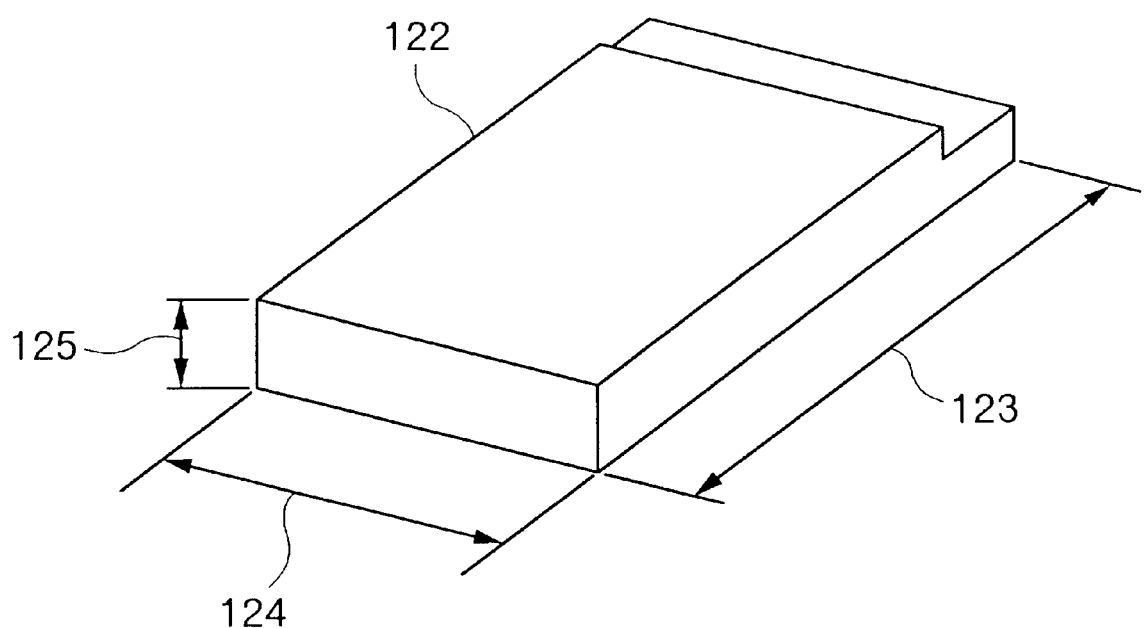
FIG. 7 is a perspective view showing a profile of the first embodiment.

These circuits are packaged in a case 122 having predetermined outer dimensions as shown in FIG. 7. This case 122 has the same outer dimensions as the memory card inserted into the personal computer. For example, the size is 85.6 mm (longitudinal dimension 123) by 54.0 mm (lateral dimension 124). Also, the height 125 is 3.3 mm, 5.0 mm or 10.5 mm. With the height of 10.5 mm, the lateral size assumes 85.6 mm to a maximum of 135.6 mm. Outer dimensions other than described above may be defined. The outer surface of the case 122 is formed of an insulating synthetic resin, the interior of which is conductively plated with a metal. This metal plating is connected to the earth. A shield cover or a metal frame may be used instead of the metal plating.

As described above, the card-type electronic tuner according to the invention has the same outer dimensions as a memory card, and therefore can be inserted without any hardware modification into the memory card slot of the personal computer. As a result, the digitally-modulated broadcast or the like can be received without changing the hardware of the personal computer.

Figure 5:
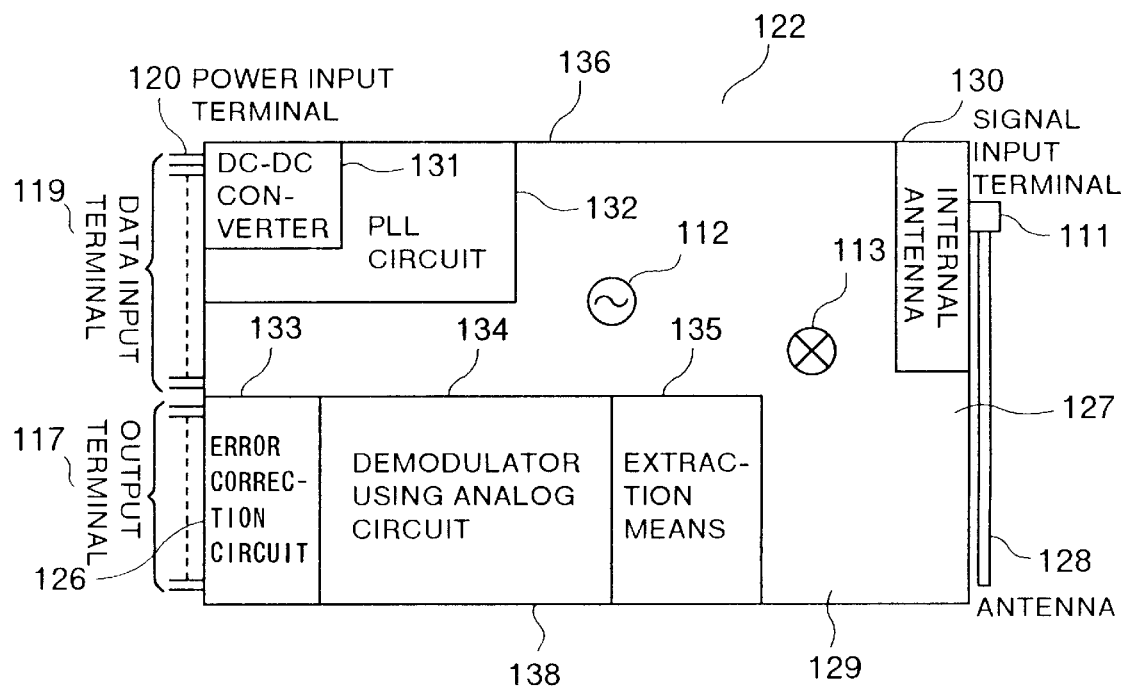
FIG. 5 is a diagram showing a circuit layout according to the first embodiment.

Now, a circuit layout will be described with reference to FIG. 5. In FIG. 5, an output terminal 117, a data input terminal 119 and a power input terminal 120 are arranged on one lateral side 126 of a case 122. These terminals are fitted in a connector in the depth of the slot to exchange signals with the personal computer when the case 122 is inserted into the memory card slot. Also, a signal input terminal 111 is provided on the other lateral side 127 opposed to the lateral side 126. A rod antenna 128 is mounted on the signal input terminal 111. An external antenna may be connected to the signal input terminal 111 by cable in place of using the rod antenna.

In this way, since the signal input terminal 111 is mounted on the reverse side of the case 122 of the card-type electronic tuner, a high-frequency signal can be connected directly to the signal input terminal 111. It is therefore not necessary to take special measure to introduce a high-frequency signal into the personal computer. In other words, the personal computer can receive a digitally-modulated broadcasting without any hardware modification such as addition of an antenna to the personal computer.

Further, a printed board 129 is mounted in the case 122 and has the following circuits arranged thereon. An internal antenna 130 may be provided in the vicinity of the signal input terminal 111. Furthermore, a mixer 113 is arranged in the vicinity of the signal input terminal 111, and a local oscillator 112 is disposed in the vicinity of the mixer 113. A DC-DC converter 121 is packaged by being defined by a metal partitioning plate 131 (which may be made of other materials to the extent that such materials have a conductivity such as resin plating) in the vicinity of the power input terminal 120. A PLL circuit 118 is packaged in the vicinity of the data input terminal 119 by being defined by a metal partitioning plate 132. Further, an error correction circuit 116 defined by a metal partitioning plate 133, a demodulator 115 defined by a metal partitioning plate 134 adjacently to the definition of the error correction circuit 116, and extraction means 114 defined by a metal partitioning plate 135 adjacently to the demodulator 115, are packaged in the vicinity of the output terminal 117.

More specifically, the PLL circuit 118 is located in the vicinity of a longitudinal side 136 of the case 122, while the digital signal processing means 137 including the extraction means 114, the demodulator 115 and the error correction circuit 116 is located in the vicinity of the other longitudinal side 138. The PLL circuit 218 and the digital signal processing means 137 thus are at some distance from each other.

As described above, in a card-type electronic tuner for receiving digitally-modulated broadcasting or the like, it is important to prevent the PLL circuit 118 from having an effect on the digital signal processing means 137. Arrangement of the digital signal processing means 137 in the vicinity of the PLL circuit 118 would make impossible normal digital processing due to the effect from clock pulses of the PLL circuit 118.

Figure 6:
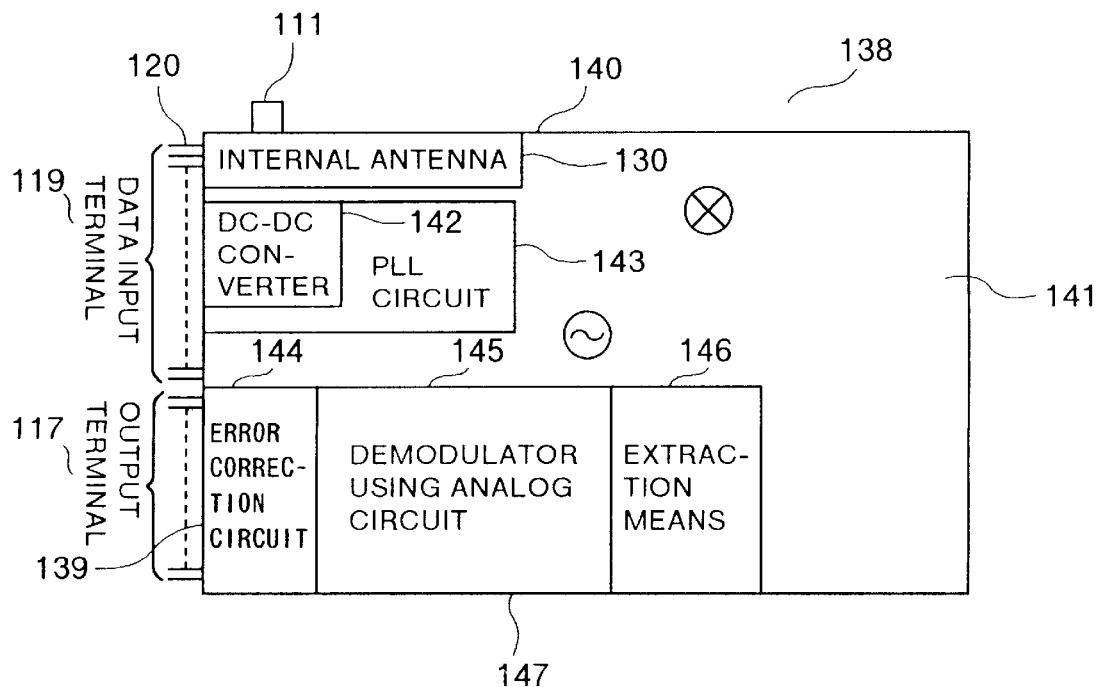
FIG. 6 is a diagram showing another circuit layout according to the first embodiment.

Another circuit layout will be described with reference to FIG. 6. In FIG. 6, an output terminal 117, a data input terminal 119 and a power input terminal 120 are arranged on one lateral side 139 of a case 138 (which has the same outer dimensions as the case 122). The signal input terminal 111 is also arranged on the lateral side 139 (not shown). This signal input terminal 111 may alternatively be arranged on a longitudinal side 140 in the vicinity of the lateral side 139.

This configuration corresponds to the case in which a high-frequency signal is already applied to the personal computer.

A printed board 141 is mounted in the case 138. The printed board 141 has circuits arranged thereon in the manner mentioned below. An internal antenna 130 is arranged in the vicinity of the signal input terminal 111. This internal antenna 130 is not required in the case where a high-frequency signal is applied to the signal input terminal 111. A DC-DC converter 121 defined by a metal partitioning plate 142 is packaged in the vicinity of the power input terminal 120. A PLL circuit defined by a metal partitioning plate 143 is packaged in the vicinity of the data input terminal 119. Further, an error correction circuit 116 defined by a metal partitioning plate 144, a demodulator 115 defined by a metal partitioning plate 145 adjacently to the error correction circuit 116, and extraction means 114 defined by a metal partitioning plate 146 adjacently to the demodulator 115, are packaged in the vicinity of the output terminal 117.

More specifically, also in this case, the PLL circuit 118 is located in the vicinity of a longitudinal side 140 of the case 138, while digital signal processing means 137 including the extraction means 114, the demodulator 115 and the error correction circuit 116 is arranged in the vicinity of the other longitudinal side 147 of the case 138. The PLL circuit 118 and the digital signal processing means 137 are thus at some distance from each other. The reason is the same as that for the case shown in FIG. 5.

In FIG. 5 or 6, the PLL circuit 118 and the digital signal processing means 137 are separated from each other by metal partitioning plates (132, 143; or 133, 134, 135 and 144, 145, 146). By thus separating the PLL circuit 118 and the digital signal processing means 137 from each other by metal partitioning plates, the isolation between the circuits is improved with the digital signal processing means 137 having no effect on the PLL circuit 118. Also, in both FIG. 5 and FIG. 6, component parts can be concentrated on one side, while patterns and printed resistors are formed on the other side to further reduce the product thickness.

Figure 8:
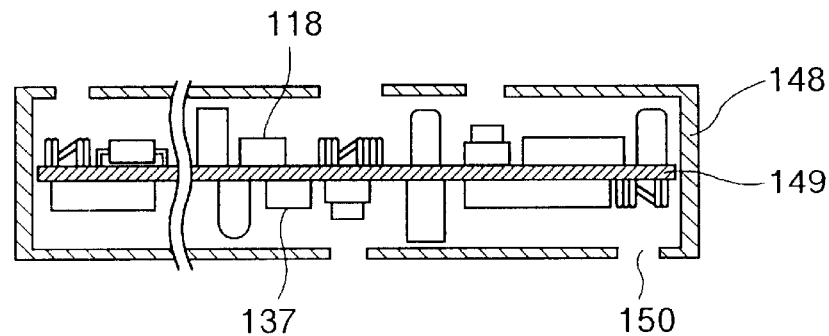
FIG. 8 is a sectional view showing the same embodiment.
Figure 9:
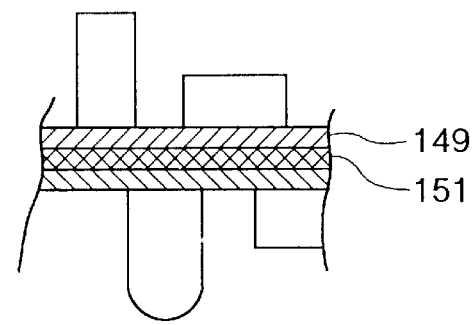
FIG. 9 is an enlarged sectional view showing the essential parts of the first embodiment.

FIG. 8 shows a card-type electronic tuner comprising a case 148 (which has the same outer dimensions as the case 122), in which a multilayer printed board 149 is mounted with a PLL circuit 118 mounted on one side thereof and with the digital signal processing means 137 mounted on the other side thereof. Numeral 150 designates an aperture for adjusting the adjust parts such as a coil from outside. FIG. 9 is a sectional view showing the essential parts of the multlayer printed board 149. Numeral 151 designates an internal layer of the multilayer printed board 149. The earth is connected to the copper foil of the internal layer 151 for isolating the PLL circuit 118 and the digital signal processing means 137 from each other. A two-side printed board may be used in place of the multilayer printed board 149. In the case where parts are packaged on the two sides, the printed board is preferably mounted at the substantial center along the thickness of the case 148 to attain a high efficiency.

Figure 10:
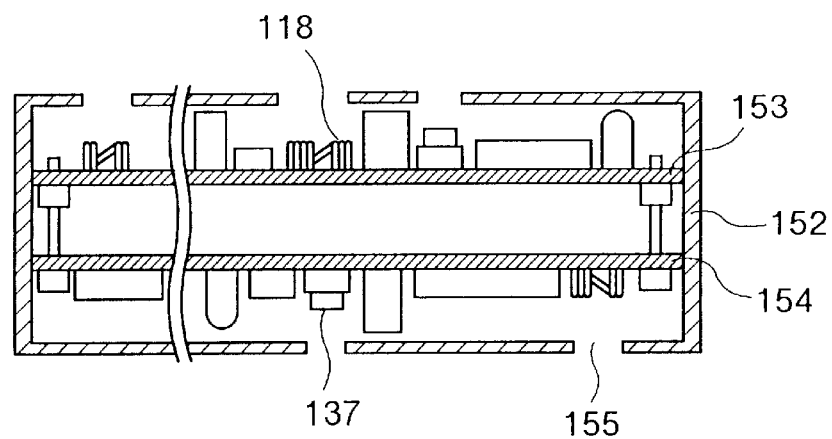
FIG. 10 is another sectional view showing the first embodiment.

FIG. 10 shows a card-type electronic tuner comprising a case 152 (which has the same outer dimensions as the case 122), in which two printed boards 153 and 154 are accommodated in two layers. The PLL circuit 118 is mounted on a printed board 153, while the digital signal processing means 137 is arranged on the other printed board 154. In this configuration, numeral 155 designates an aperture for adjusting the adjust parts such as a coil from outside. In this way, the two printed boards 153 and 154 are provided with the part-mounted sides thereof oriented outward to isolate the PLL circuit 118 and the digital signal processing means 137 from each other. Also, this isolated structure into two sheets facilitates handling according to the capacity of the digital signal, handling by destination and addition of other optional functions simply by replacing the printed board 137 of the digital signal processing means. Insertion of a partitioning plate between the two printed boards can reduce interferences.

FIG. 11 is a diagram for explaining the extraction means 114. Single-axis extraction means 114a is shown in FIG. 11A, and double-axis extraction means 114b for extracting orthogonal I and Q signals is illustrated in FIG. 11B. The former is used for FSK or BPSK, and the latter for QPSK, QPK or QAM.

[Embodiment 2]

Figure 12:
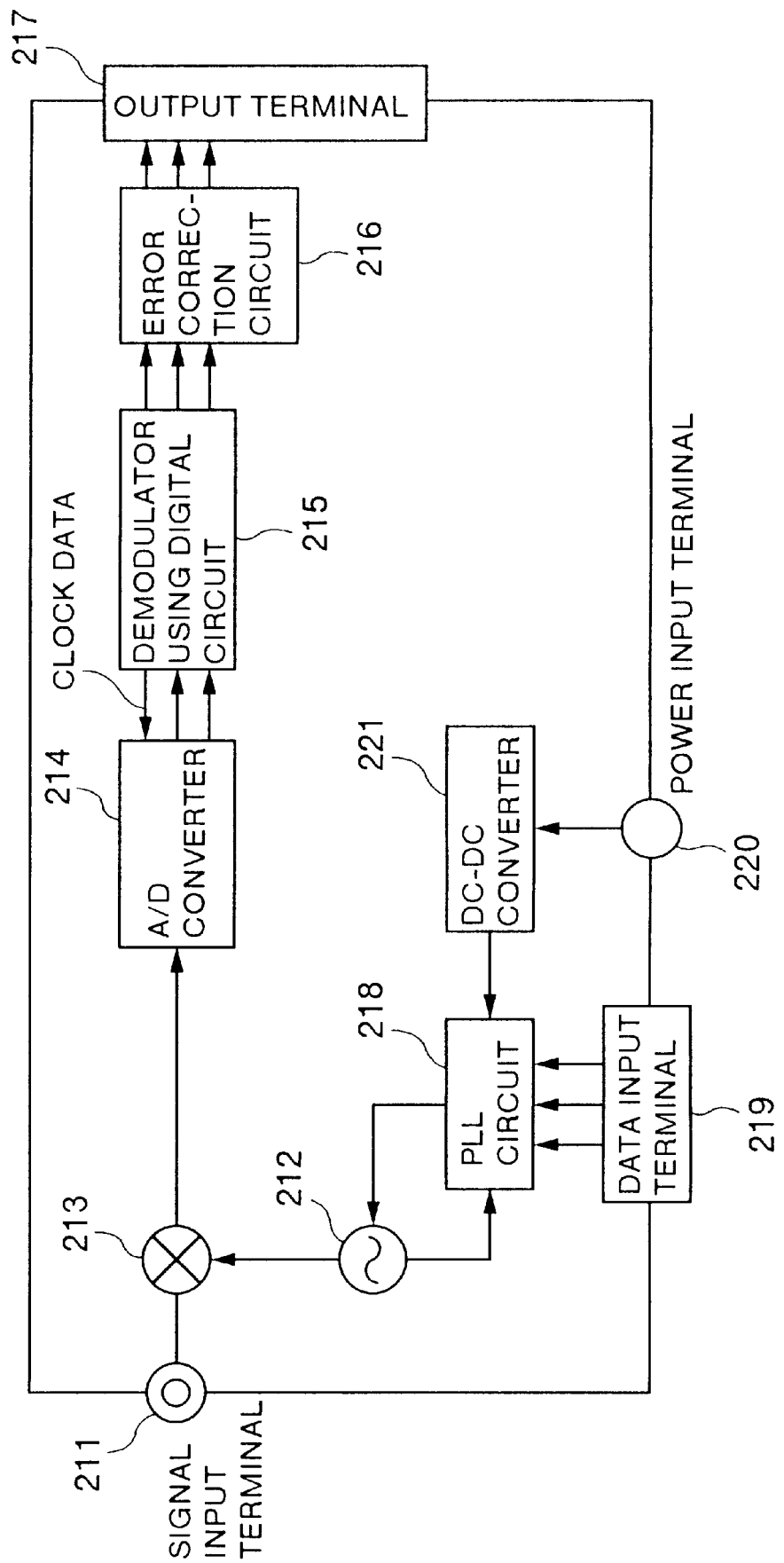
FIG. 12 is a block diagram showing a card-type electronic tuner according to a second embodiment of the invention.

FIG. 12 shows a second embodiment of the invention. In FIG. 12, an electrical circuit of a card-type electronic tuner according to the invention comprises a signal input terminal 211 supplied with a high-frequency signal, a mixer 213 having an input terminal supplied with the signal from the signal input terminal 211 and having the other input terminal thereof connected to the output of a local oscillator 212, an A/D converter 214 connected to the output of the mixer 213, a demodulator 215 including a digital circuit connected with the output of the A/D converter 214, an error correction circuit 216 connected to the output of the demodulator 215, an output terminal 217 connected to the output of the error correction circuit 216, a PLL circuit 218 having an input terminal thereof connected to the output of the local oscillator 212 and having a PLL signal output terminal connected to the input terminal of the local oscillator 212, a data input terminal 219 for supplying a data signal to the PLL circuit 218, a power input terminal 220 and a DC-DC converter 221 inserted between the power input terminal 220 and the PLL circuit 218.

The operation of the card-type electronic tuner configured as described above will be explained below.

The high-frequency signal applied to the signal input terminal 211 becomes an intermediate frequency through the tuning operation at the mixer 213 and the local oscillator 212. The information in this intermediate frequency signal is a digitally-modulated cosine wave, for example, and will hereinafter be referred to as the cosine wave. First, this cosine wave is split finely on time base directly, and converted into digital signals at the A/D converter 214. This digital information is directly applied to the demodulator 215, from which frequency and phase information are retrieved digitally. This information is fed back as clock data to the A/D converter 214 and synchronously detected. The phase can be synchronously detected in the demodulator 215, in which case the A/D converter 214 performs pseudo synchronous detection only for the frequency. In this way, the cosine wave information is directly processed in digital fashion, and therefore there occurs little phase deviation due to demodulation. Especially, for lack of division between I and Q signals, the orthogonal accuracy of I and Q axes is high. As a result, the error rate is low. Use of the digital IC technique simplifies the circuit configuration suitably for size reduction. Under the circumstances, however, the high-speed A/D converter 214 and the demodulator 215 which handle the cosine wave information directly in digital fashion are expensive to use. Also, a sufficiently high clock frequency is not yet available. Applications therefore are confined to a low-frequency narrow band signal. A case of narrow band is CATV of 6 MHz. In this case, the transmission rate of 30 Mbps is available using the QAM scheme. The demodulation signal thus produced is subsequently applied for error correction at the error correction circuit 216. An error-corrected signal is then applied toward the personal computer from the output terminal 217, and digitally processed in the personal computer.

Figure 13:
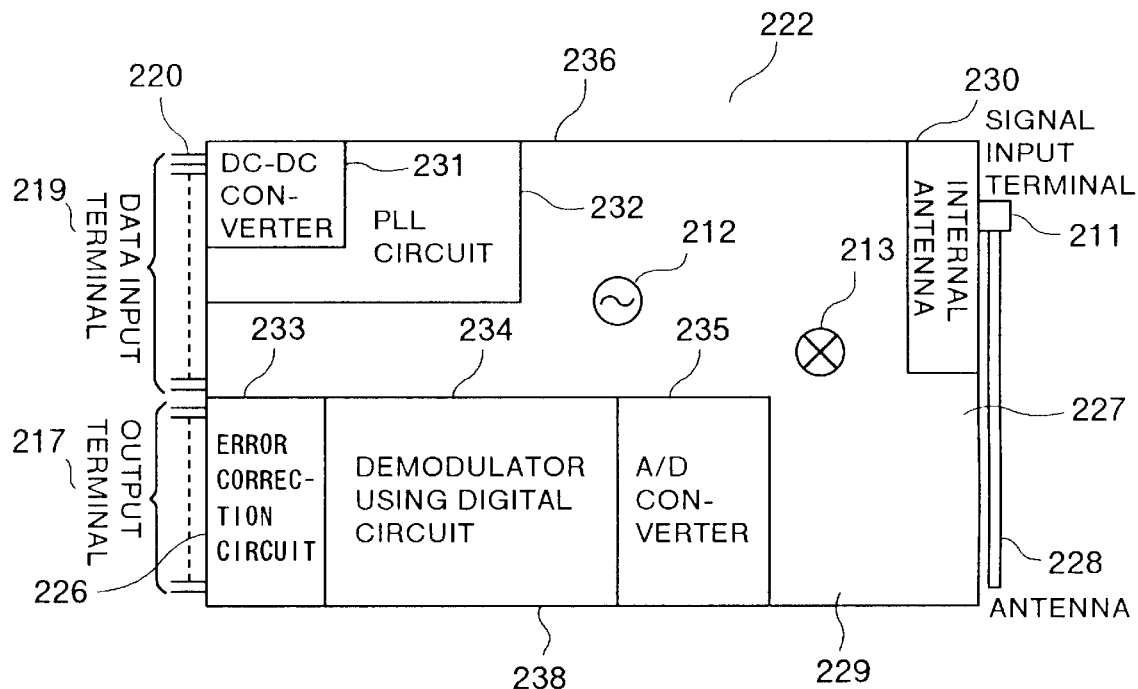
FIG. 13 is a diagram showing a circuit layout according to the second embodiment.

A circuit layout will be explained with reference to FIG. 13. In FIG. 13, an output terminal 217, a data input terminal 219 and a power input terminal 220 are provided on one lateral side 226 of a case 222 (which has the same outer dimensions as the case 122). These terminals, when the case 222 is inserted into a memory card insertion slot, are fitted into a connector in the depth of the slot to exchange signals with the personal computer. A signal input terminal 211 is provided on the other lateral side 227 in opposed relation to the lateral side 226. This signal input terminal 211 has a rod antenna 228 mounted thereon. An external antenna may be used in place of the rod antenna 228.

As described above, the signal input terminal 211 is arranged on the reverse side of the case 222 of a card-type electronic tuner. A high-frequency signal can therefore be connected directly to the signal input terminal 211. It is not necessary to provide means for introducing a high-frequency signal into the personal computer. More specifically, digital broadcasting or the like can be received by the personal computer without modifying the hardware thereof.

A printed board 229 is mounted in the case 222 and has the following circuits arranged thereon. An internal antenna 230 may be disposed in the vicinity of the signal input terminal 211. Further, a mixer 213 is arranged in the vicinity of the signal input terminal 211, and a local oscillator 212 in the vicinity of the mixer 213. Also, a DC-DC converter 221 defined by a metal partitioning plate 231 is packaged in the vicinity of the power input terminal 220. A PLL circuit 218 defined by a partitioning plate 232 is packaged in the vicinity of the data input terminal 219. Furthermore, an error correction circuit 216 defined by a metal partitioning plate 233, a demodulator 215 defined by a metal partitioning plate 234 adjacently to the error correction circuit 216, and an A/D converter 214 defined by a metal partitioning plate 235 adjacently to the demodulator 215, are packaged in the vicinity of the output terminal 217.

In other words, the PLL circuit 218 is located in the vicinity of one longitudinal side 236 of the case 222, while the digital signal processing means 237 including the A/D converter 214, the demodulator 215 and the error correction circuit 216 is located in the vicinity of the other longitudinal side 238. The PLL circuit 218 and the digital signal processing means 237 are thus arranged at a distance from each other.

As will be seen from the foregoing description, in a card-type electronic tuner for receiving digital broadcasting, it is important to prevent the PLL circuit 218 from having an effect on the digital signal processing means 237. Assuming that the digital signal processing means 237 is arranged in the vicinity of the PLL circuit 218, normal digital processing would become impossible under the influence of clock pulses from the PLL circuit 218.

Figure 14:
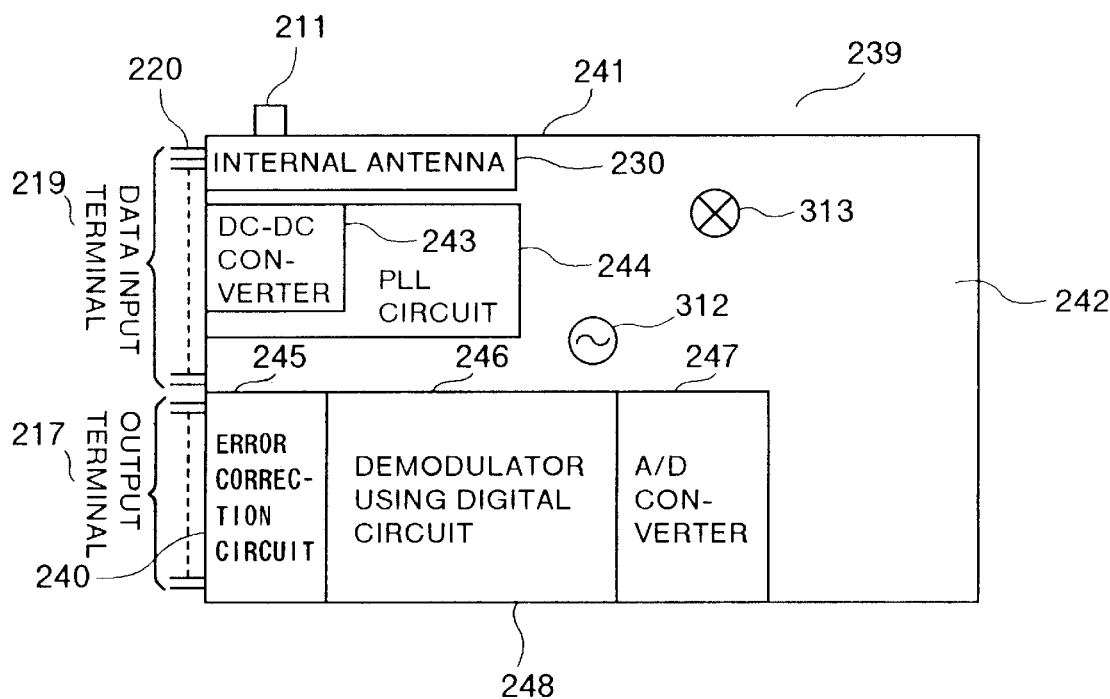
FIG. 14 is a diagram showing another circuit layout according to the second embodiment.

Another circuit layout will be explained with reference to FIG. 14. In FIG. 14, an output terminal 217, a data input terminal 219 and a power input terminal 220 are arranged on one lateral side 240 of a case 239 (which has the same outer dimensions as the case 122). A signal input terminal 211 is also arranged on the same lateral side 240 (not shown). This signal input terminal 211 may alternatively be arranged on the longitudinal side 241 in the vicinity of the lateral side 240.

This case therefore corresponds to the case in which a high-frequency signal is already applied to the personal computer.

The case 239 has a printed board 242 mounted therein. This printed board 242 has the following circuits arranged thereon. An internal antenna 230 is arranged in the vicinity of the signal input terminal 211. The internal antenna 230 is not required in the case where a high-frequency signal is applied to the signal input terminal 211. A DC-DC converter 221 is packaged by being defined by a metal partitioning plate in the vicinity of the power input terminal 220. A PLL circuit 218 is packaged by being defined by a metal partitioning plate 244 in the vicinity of the data input terminal 219. Further, an error correction circuit 216 defined by a metal partitioning plate 245, a demodulator 215 defined by a metal partitioning plate 246 adjacently to the area of the error correction circuit 216, and an A/D converter 214 defined by a metal partitioning plate 247 adjacently to the demodulator 215, are packaged in the vicinity of the output terminal 217.

More specifically, also in this case, the PLL circuit 218 is located in the vicinity of one longitudinal side 241 of the case 239, while the digital signal processing means 237 including the A/D converter 214, the demodulator 215 and the error correction circuit 216 is positioned in the vicinity of the other longitudinal side 248. The PLL circuit 218 and the digital signal processing means 237 thus are placed at a distance from each other. The reason for this is the same as that for the case shown in FIG. 13.

In FIG. 13 or 14, the PLL circuit 218 and the digital signal processing means 237 are defined by metal partitioning plates (232, 244; or 233, 234, 235 and 245, 246, 247). In this way, the partitioning of the PLL circuit 218 and the digital signal processing means 237 from each other by a metal partitioning plate improves the isolation between the two circuits and prevents the PLL circuit 218 from having an effect on the digital signal processing means 237.

Also according to this embodiment, the packaging method disclosed in FIGS. 8, 9 and 10 is possible. In FIGS. 13 and 14, parts may be concentrated on one side while patterns and printed resistors are formed on the other side, thereby further reducing the thickness.

[Embodiment 3]

Figure 1:
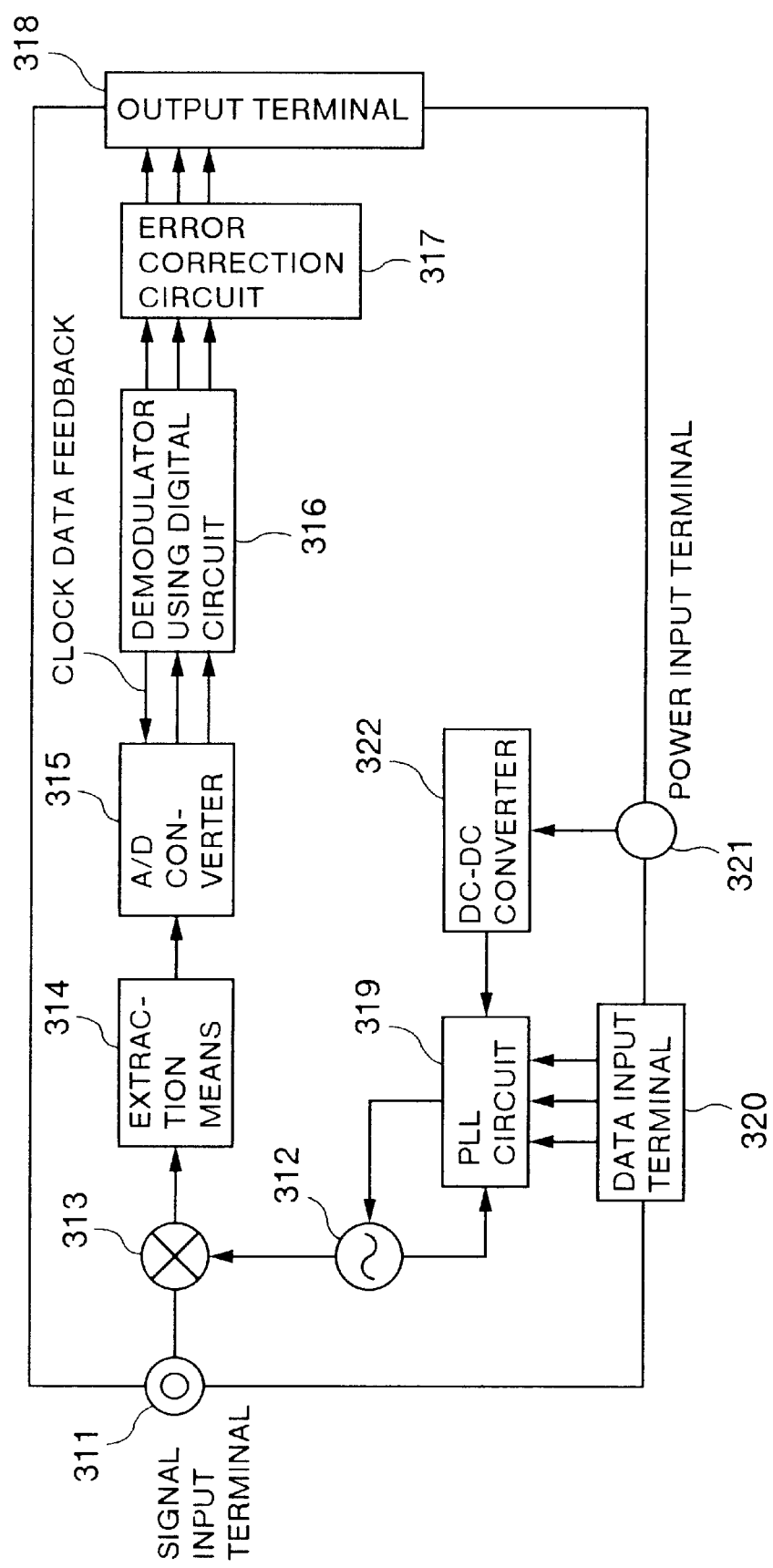
FIG. 1 is a block diagram showing a card-type electronic tuner according to a third embodiment of the present invention.

A third embodiment of the invention is shown in FIG. 1. In FIG. 1, an electrical circuit of a card-type electronic tuner according to the present invention comprises a signal input terminal 322 supplied with a high-frequency signal, a mixer 313 having an input terminal supplied with a signal from the signal input terminal 311 and having the other input terminal connected to an output from a local oscillator 312, extraction means 314 connected with the output of the mixer 313, a low-pass filter (not shown) connected with the output of the extraction means 314, an A/D converter 315 connected with the output of the low-pass filter, a demodulator 316 using a digital circuit connected with the output of the A/D converter 315, an error correction circuit 317 connected to the output of the demodulator 316, an output terminal 318 connected to the output of the error correction circuit 317, a PLL circuit 319 having an input terminal connected to the output of the local oscillator 312 and having a PLL signal output terminal connected to the input terminal of the local oscillator 312, a data input terminal 320 for supplying a data signal to the PLL circuit 319, a power input terminal 321, and a DC-DC converter 322 inserted between the power input terminal 321 and the PLL circuit 319.

The operation of a card-type electronic tuner as configured above will be explained.

The high-frequency signal applied to the signal input terminal 311 makes up an intermediate frequency by being frequency-selected at the mixer 313 and the local oscillator 312. This intermediate frequency, as described with reference to the first embodiment, is applied to the extraction means 314, where the input digital modulated wave is multiplied by a cosine wave, for example, substantially equal to the modulated wave thereby to extract information as an absolute term. The double frequency which simultaneously appears in the process is removed by the low-pass filter inserted in the next stage. The modulated wave, however, has some deviation from the cosine wave generated in the extraction means 314 in frequency and phase. Information attributable to this deviation is demodulated at the A/D converter 315 and the demodulator 316 using a digital circuit. The extraction means 314 thus has the feature that the use of an analog local oscillator as in the first embodiment makes it possible to apply a high intermediate frequency (i.e., broad-band signal). In the case where the feedback as shown in the first embodiment is not required for the extraction means. 314, the local oscillator 312 may be fixed. If feedback is applied, on the other hand, the error rate is reduced. Also, all that is required of the A/D converter 315 or the demodulator 316 using a digital circuit is to complement the demodulation due to the small frequency or phase deviation caused in the extraction means 314. Therefore, the processing speed of the A/D converter 315 or the demodulator 316 need not be high, thus realizing a low-cost demodulator. The demodulation signal thus obtained is applied to the error correction circuit 317 where the error contained in the signal is corrected. The resulting error-corrected signal is output from the output terminal 318 toward the personal computer and digitally processed in the latter. As a consequence, the highest frequency (i.e., broad-band of, say, 20 MHz in the satellite broadcasting) is allowed with a transmission rate as large as 40 Mbps for QPSK in the state of art.

Figure 2:
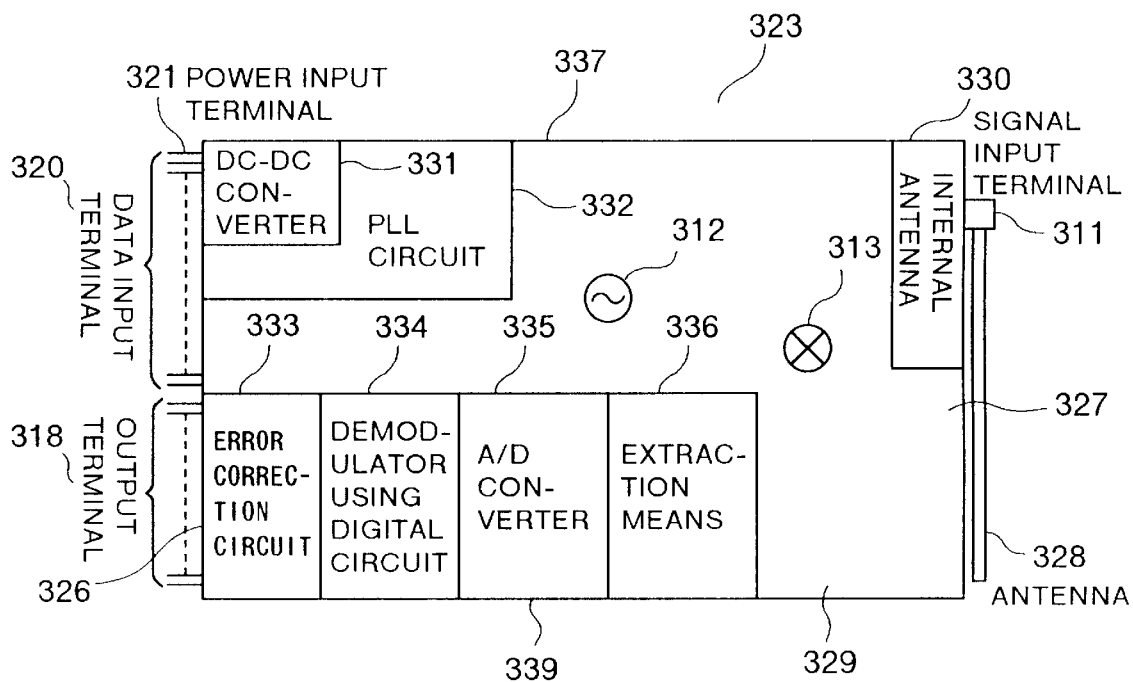
FIG. 2 is a diagram showing a circuit layout according to the third embodiment.

A circuit layout will be explained with reference to FIG. 2. In FIG. 2, an output terminal 318, a data input terminal 320 and a power input terminal 321 are arranged on one lateral side 326 of a case 323 (which has the same outer dimensions as the case 122). These terminals, when the case 323 is inserted into a memory card insertion slot, is fitted into a connector in the depth of the slot to exchange signals with the personal computer. Also, a signal input terminal 311 is disposed on the other lateral side 327 in opposed relation to the lateral side 326. This signal input terminal 311 has a rod antenna 328 mounted thereon. The signal input terminal 311 may alternatively be connected with an external antenna by cable.

As described above, the signal input terminal 311 is placed on the reverse side of the case 323 of the card-type electronic tuner, and therefore a high-frequency signal can be directly connected to the signal input terminal 311. Thus, a high-frequency signal need not be introduced into the personal computer. In other words, the digital broadcasting or the like can be received by the personal computer without modifying the hardware thereof. Also, a printed board 329 mounted in the case 323 has the following circuits arranged thereon. An internal antenna 330 may be arranged in the vicinity of the signal input terminal 311. Further, a mixer 313 is arranged in the vicinity of the signal input terminal 311, and a local oscillator 312 is placed in the vicinity of the mixer 313. A DC-DC converter 322 is packaged by being defined by a metal partitioning plate 331 in the vicinity of the power input terminal 321. A PLL circuit 319 is packaged by being defined by a metal partitioning plate 322 in the vicinity of the data input terminal 320. Furthermore, an error correction circuit 317 defined by a metal partitioning plate 333, a demodulator 316 defined by a metal partitioning plate 334 adjacently to the definition of the error correction circuit 317, an A/D converter 315 defined by a metal partitioning plate 335 adjacently to the demodulator 316 and extraction means 314 defined by a metal partitioning plate 336 adjacently to the A/D converter 316, are packaged in the vicinity of the output terminal 318.

In other words, the PLL circuit 319 is located in the vicinity of one longitudinal side 337 of the case 323, while digital signal processing means 338 including the extraction means 314, the A/D converter 315, the demodulator 316 and the error correction circuit 317 is arranged in the vicinity of the other longitudinal side 339 of the case 323, so that the PLL circuit 319 and the digital signal processing means 338 are at some distance from each other.

In this way, in a card-type electronic tuner for receiving digital broadcasts or the like, it is important to prevent the PLL circuit 319 from affecting the digital signal processing means 338. Assuming that the digital signal processing means 338 is arranged in the vicinity of the PLL circuit 319, normal digital processing would become impossible under the influence of clock pulses from the PLL circuit 319.

Figure 3:
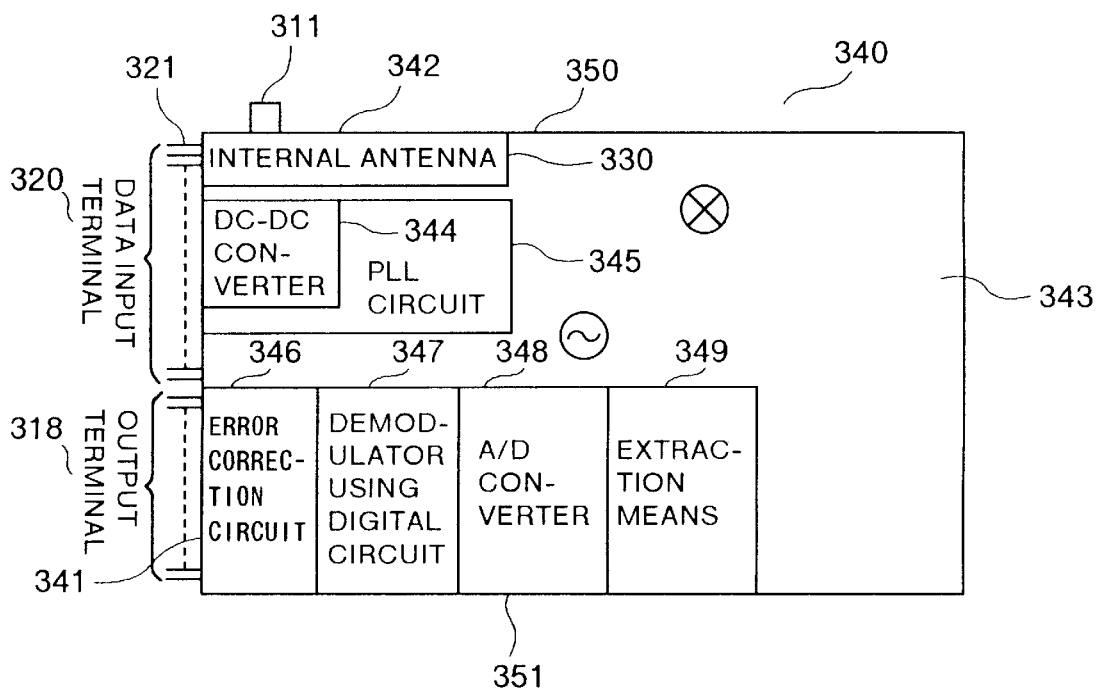
FIG. 3 is a diagram showing another circuit layout according to the third embodiment.

Another circuit layout will be explained with reference to FIG. 3. In FIG. 3, an output terminal 318, a data input terminal 320 and a power input terminal 321 are arranged on one lateral side 341 of a case 340 (which has the same outer dimensions as the case 122). A signal input terminal 311 is also arranged on the same lateral side 341 (not shown). This signal input terminal 311 may alternatively be provided on one longitudinal side 342 in the vicinity of the lateral side 341.

This case therefore corresponds to the case in which a high-frequency signal is already applied to the personal computer.

Also, a printed board 343 is mounted in the case 340, and has the following circuits arranged thereon. An internal antenna 330 is arranged in the vicinity of the signal input terminal 311. This internal antenna 330 is not required in the case where a high-frequency signal is applied to the signal input terminal 311. A DC-DC converter 322 is packaged by being defined by a metal partitioning plate 344 in the vicinity of the power input terminal 321. A PLL circuit 319 is arranged by being defined by a metal partitioning plate 345 in the vicinity of the data input terminal 320. Further, an error correction circuit 317 defined by a metal partitioning plate 346, a demodulator 316 defined by a metal partitioning plate 347 adjacently to the definition of the error correction circuit 317, an A/D converter 315 defined by a metal partitioning plate 348 adjacently to the demodulator 316 and extraction means 314 defined by a metal partitioning plate 349 adjacently to the A/D converter 315, are packaged in the vicinity of the output terminal 318.

More specifically, also in this case, the PLL circuit 319 is located in the vicinity of one longitudinal side 350 of the case 340, while the digital signal processing means 338 including the extraction means 314, the A/D converter 315, the demodulator 316 and the error correction circuit 317 is located in the vicinity of the other longitudinal side 351, so that the PLL circuit 319 and the digital signal processing means 338 are at some distance from each other. The reason is the same as that for the case shown in FIG. 2.

In FIG. 2 or 3, the PLL circuit 319 and the digital signal processing means 338 are separated from each other by metal partitioning plates (332, 345; or 333, 334, 335, 336 and 346, 347, 348, 349). In this way, separation of the PLL circuit 319 from the digital signal processing means 338 by a metal partitioning plate improves the isolation between the two circuits and prevents the PLL circuit 319 from having an effect on the digital signal processing means 338. Also according to the embodiment under consideration, the packaging disclosed in FIGS. 8, 9 and 10 may alternatively be implemented. In FIG. 2 or 3, the thickness can be further reduced by concentrating the parts on one side with patterns and printed resistors formed on the other side.

[Embodiment 4]

Figure 15:
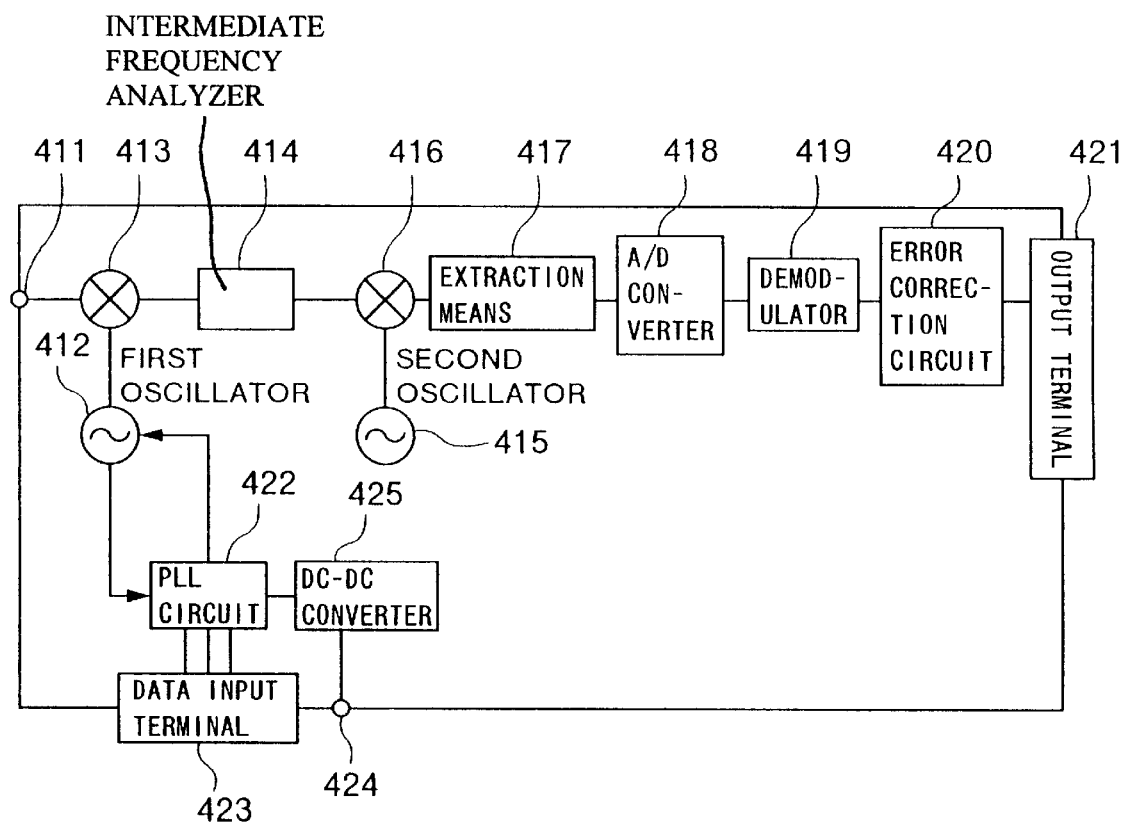
FIG. 15 is a block diagram showing a card-type electronic tuner according to a fourth embodiment of the invention.

FIG. 15 shows a fourth embodiment of the invention. In FIG. 15, an electrical circuit of a card-type electronic tuner according to the invention comprises a signal input terminal 411 supplied with a high-frequency signal, a first mixer 413 having an input terminal supplied with the signal from the signal input terminal 411 and the other input terminal connected with the output of a first local oscillator 412, an intermediate frequency amplifier 414 connected with the output of the first mixer 413, a second mixer 416 having an input terminal thereof connected to the output of the intermediate frequency amplifier 414 and the other input terminal connected with the output of the second local oscillator 415, extraction means 417 connected to the output terminal of the second mixer 416, a low-pass filter (not shown) connected with the output of the extraction means 417, an A/D converter 418 connected with the output of the low-pass filter, a demodulator 419 using a digital signal connected with the output of the A/D converter 418, an error correction circuit 420 connected with the output terminal of the demodulator 419, an output terminal 421 connected with the output of the error correction circuit 420, a PLL circuit 422 having an input connected with the output of the first local oscillator 412 and a PLL signal output terminal connected with the input terminal of the first local oscillator 412, a data input terminal 423 for supplying a data signal to the PLL circuit 422, a power input terminal 424, and a DC-DC converter 425 inserted between the power input terminal 424 and the PLL circuit 422. These circuits are accommodated in the case identical to the case 122 as in the aforementioned embodiment. Also, with regard to arrangement of parts, it is important to insert a metal partitioning plate between the first mixer 413 and the first local oscillator 412 and between the second mixer 416 and the second local oscillator 415 thereby to improve isolation and thus prevent each part from interfering with another.

The operation of a card-type electronic tuner configured as mentioned above will be explained below.

A high-frequency signal of, say, 300 MHz input to the signal input terminal 411 makes up a first intermediate frequency of about 27 MHz by being tuned by the first mixer 413 and the first local oscillator 412. This intermediate frequency is reconverted in frequency by the second mixer 416 and the second oscillator 415 into a second intermediate frequency of, say, about 450 kHz. In order to demodulate this second intermediate frequency, as described with reference to the third embodiment, the digital modulation wave derived from the extraction means 417 is multiplied by a cosine wave substantially equal to the modulation wave, so that information is extracted as an absolute term. The double frequency appearing in this process is removed by a low-pass filter inserted in the next stage. The modulation wave, however, has some deviation from the cosine wave generated in the extraction means 417 in frequency and phase. Information attributable to this deviation is demodulated at the A/D converter 418 and the demodulator 419 using a digital circuit in the next stage. An error is then corrected at the error correction circuit 420. This errorcorrected signal is applied to the personal computer from the output terminal 421 and digitally processed in the personal computer.

As described above, according to the present invention, two mixers are employed to reduce image interferences. Consequently, a high-density communication with small frequency intervals is made possible.

The packaging as disclosed in FIGS. 5, 6, 8, 9 and 10 may alternatively be used in the embodiment under consideration.

[Embodiment 5]

Figure 16:
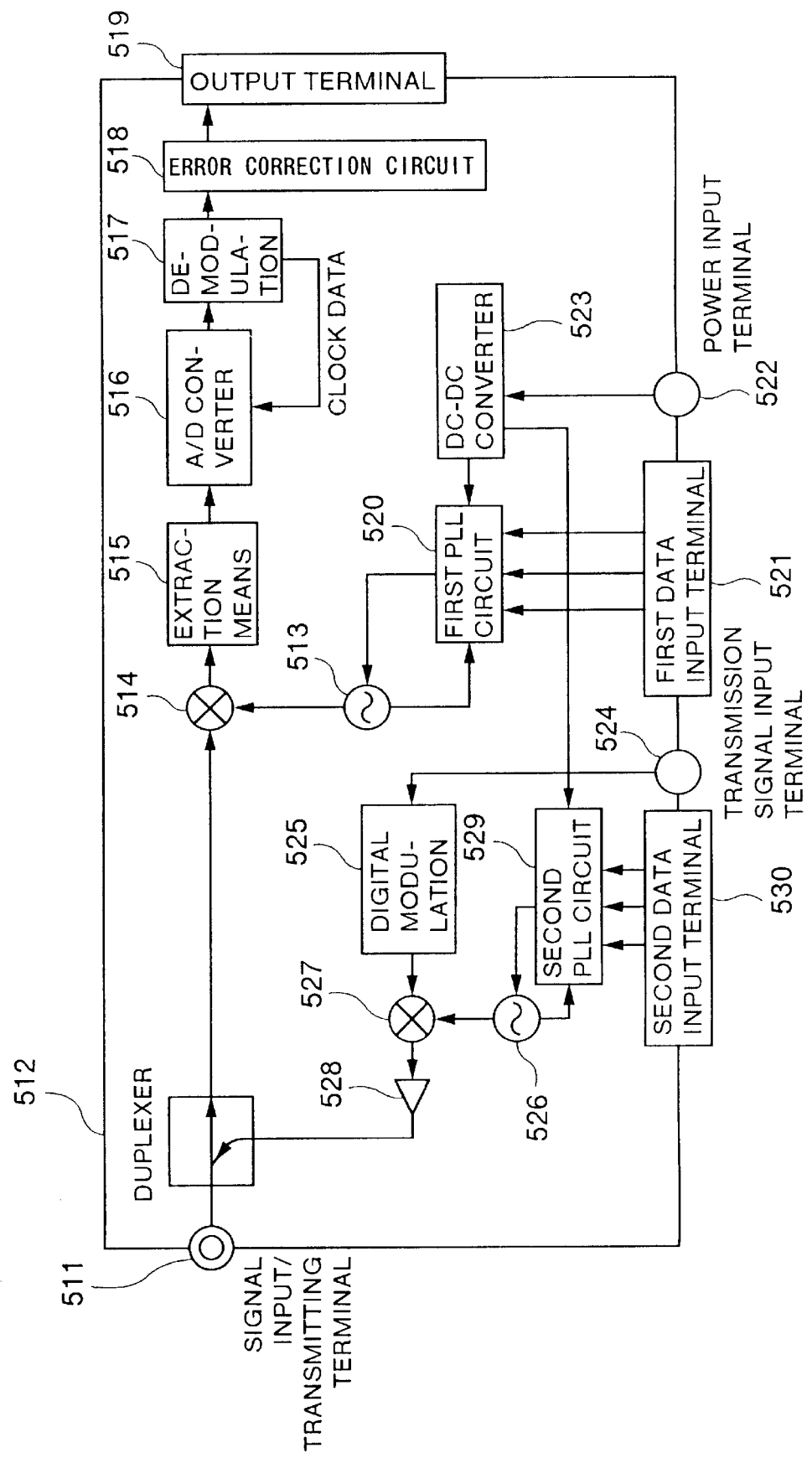
FIG. 16 is a block diagram showing a card-type electronic tuner according to a fifth embodiment of the invention.

A fifth embodiment of the invention is shown in FIG. 16. In FIG. 16, an electrical circuit of a card-type electronic tuner according to the invention comprises a signal input/output terminal 511 for producing and receiving a high-frequency signal, a duplexer 512 connected with the signal from the signal input/output terminal 511, a first mixer 514 having an input terminal supplied with the output of the duplexer 512 and the other input terminal connected with the output terminal of a first local oscillator 513, extraction means 515 connected with the output signal of the first mixer 514, a low-pass filter (not shown) connected with the output of the extraction means 515, an A/D converter 516 connected with the output of the low-pass filter, a demodulator 517 using a digital circuit connected with the output of the A/D converter 516, an error correction circuit 518 connected with the output of the demodulator 517, an output terminal 519 connected with the output terminal of the error correction circuit 518, a first PLL circuit 520 having an input terminal connected with the output of the first local oscillator 513 and a PLL signal output terminal connected to the input terminal of the first local oscillator 513, a first data input terminal 521 for supplying a data signal to the first PLL circuit 520, a power input terminal 522, a DC-DC converter 523 inserted between the power input terminal 522 and the PLL circuit 520, a transmission signal input terminal 524, digital modulation processing means 525 connected to the input terminal 524, a second mixer 527 having an input terminal connected to the output of the digital modulation processing means 525 and the other input terminal thereof connected to the output of the second local oscillator 526, a high-frequency amplifier circuit 528 inserted between the output of the second mixer 527 and the input of the duplexer 512, a second PLL circuit having an input terminal connected with the output terminal of the second local oscillator 526 and a PLL signal output terminal connected to the input of the second local oscillator 526, and a second data input terminal 530 for supplying a data signal to the second PLL circuit 529. Also, the second PLL circuit 529 is connected with the output of the DC-DC converter 523.

These circuits are accommodated in the same case as the case 122 as in the foregoing embodiments. As a consequence, the card-type electronic tuner according to the invention can be inserted directly into a memory card slot without modifying the hardware of the personal computer.

Also, with regard to the layout of parts, it is important to prevent mutual interferences by improving the isolation between the first local oscillator 513 and the second local oscillator 526 and between the digital modulation means 525 and the second PLL circuit 529. In other words, the concept is identical to that of the first embodiment shown in FIGS. 5, 6, 8, 9 and 10.

The operation of the card-type electronic tuner as configured as above will be explained below.

First, reference is had to the receiving system. A high-frequency signal applied to the signal input/output terminal 511 is applied through a duplexer 512 and, by way of the tuning operation by the mixer 514 and the local oscillator 513, makes up an intermediate frequency. This intermediate frequency, as described with reference to the third embodiment, is digitally demodulated by the extraction means 515, the A/D converter 516 and the demodulator 517 using a digital circuit. This demodulation signal is corrected in error by the error correction circuit 518. The error-corrected signal is output toward the personal computer from the output terminal 519 and is digitally processed in the personal computer. Now, the transmission system will be described below. The signal applied to the transmission signal input terminal 524 is digitally modulated at the digital modulation processing means 525 according to, say, Equation 3.

$$\pm \cos \omega t \qquad (3)$$

The digitally-modulated signal is carried on a carrier wave of, say, about 300 MHz through the second mixer 527 and the second local oscillator 526 in the next stage and is power amplified at the high-frequency amplifier 528. The output of the high-frequency amplifier 528 is applied through the duplexer 512 to the signal input/output terminal 511. The duplexer 512 is inserted for the purpose of preventing the signal of the transmission system from circumventing into the receiving system.

As described above, a card-type electronic tuner according to the invention comprises a transmission system in addition to a receiving system and therefore is capable of bidirectional digital transmission.

Figure 17:
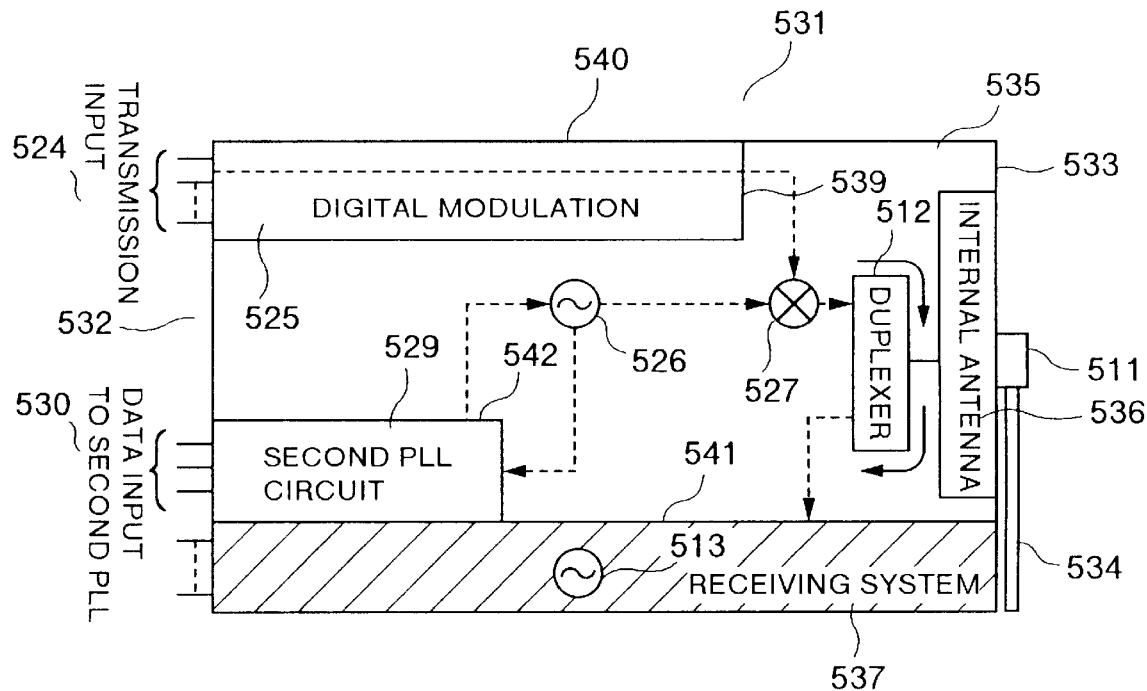
FIG. 17 is a diagram showing a circuit layout according to the fifth embodiment.

Now, a circuit layout will be described in detail with reference to FIG. 17. In FIG. 17, a case 531 (which has the same outer dimensions as the case 122) is spit into two parts for packaging the transmission system and the receiving system. Only the transmission system will be described since the same consideration as in the third embodiment applies to the receiving system.

A transmission signal input terminal 524 and a second data input terminal 530 are provided on a lateral side 532 of the case 531. These terminals, when the case 531 is inserted into the memory card slot, are fitted in the connector provided in the depth of the slot thereby causing signals to be exchanged with the personal computer. A signal input/output terminal 511 is provided on the other lateral side 533 in opposed relation to the lateral side 532. This signal input/output terminal 511 has a rod antenna 534 mounted thereon. This signal input/output terminal 511 may alternatively be connected to an external antenna by means of cable.

As described above, since the signal input/output terminal 511 is located on the reverse side of the case 531 of the card-type electronic tuner, a high-frequency digital signal can be directly connected to the signal input/output terminal 511. As a result, it is not necessary to introduce a high-frequency signal into the personal computer. More specifically, digital broadcasting or the like can be transmitted to or received by the personal computer without changing the hardware of the personal computer. Also, a printed board 535 is mounted in the case 531 and has the following circuits arranged thereon. An internal antenna 536 may be provided in the vicinity of the signal input/output terminal 511. Further, the duplexer 512, the second mixer 527 and the second local oscillator 526 are arranged in that order toward the lateral side 532 in the vicinity of the signal input/output terminal 511. The output of the duplexer 512 is wired to the definition chamber 537 of the receiving system.

The digital modulation processing means 525 is provided on one longitudinal side 540 by being surrounded by a metal partitioning plate 539 adjacently to a transmission signal input terminal 524 provided on the lateral side 532. The transmission system and the receiving system are isolated from each other by a metal partitioning plate 541 The second PLL circuit 529 is disposed adjacently to the second data input terminal 530 on the lateral side 532 separated by a metal partitioning plate 542.

In other words, the digital modulation processing means 525 is packaged at a point distant from the second PLL circuit 529 and is isolated therefrom in terms of high frequency by means of partitioning plates 539 and 542. Also, the second local oscillator 526 and the first local oscillator 513 packaged in the receiving system are separated with some spatial distance from each other and isolated in terms of high frequency by the partitioning plate 541.

Figure 18:
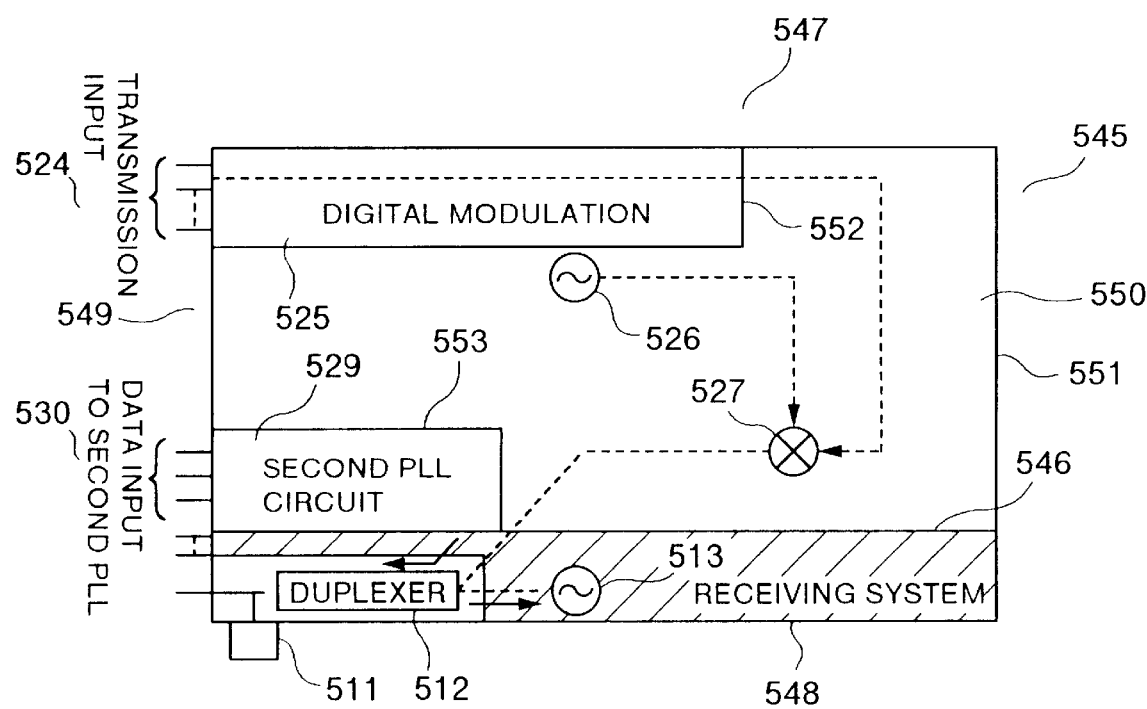
FIG. 18 is a diagram showing another circuit layout according to the fifth embodiment.

Another circuit layout will be described with reference to FIG. 18. In FIG. 18, a case 545 (which has the same outer dimensions as the case 122) is isolated into two portions by a metal partitioning plate 546. A transmission system is packaged on one longitudinal side 547 thereof, and a receiving system on the other longitudinal side 548. Since the receiving system is based on the same concept as the third embodiment, description will be made only about the transmission system.

A transmission signal input terminal 524 and a second data input terminal 530 are provided on a lateral side 549 of the case 545. These terminals, when the case 545 is inserted into a memory card insertion slot, is fitted into a connector in the depth of this slot to exchange signals with the personal computer. Also, a signal input/output terminal 511 is provided on a lateral side 549 or on a longitudinal side 548 in the vicinity of the lateral side 549. The signal input/output terminal 511 may alternatively be provided on the lateral side 549.

A printed board 550 is mounted in the case 545 and has the following circuits arranged thereon. A duplexer 512 is provided in the vicinity of the signal input/output terminal 511. Numeral 513 designates a first local oscillator provided in the receiving system. Numeral 527 designates a second mixer arranged in the vicinity of the other lateral side 551 in the transmission system. The second local oscillator 526 is arranged on one longitudinal side 547.

The digital modulation processing means 525 is arranged on the longitudinal side 547 surrounded by a metal partitioning plate 552 adjacently to the transmission signal input terminal 524 on the lateral side 549. The second PLL1 circuit 529, which is separated by a metal partitioning plate 553, is arranged on the other longitudinal side 548 adjacently to the second data input terminal 530 on the lateral side 549.

In other words, the digital signal processing means 525 is packaged at some distance from the second PLL circuit 529 on the one hand and is insulated in terms of high frequency by means of partitioning plates 552 and 553 therebetween. Also, the second local oscillator 526 and the first local oscillator 513 packaged in the receiving system are isolated from each other with some spatial distance therebetween and are insulated in terms of high frequency from each other by means of a partitioning plate 546.

As described above, an example application of a card-type electronic tuner having a transmission system and a receiving system will be explained below.

Figure 19A:
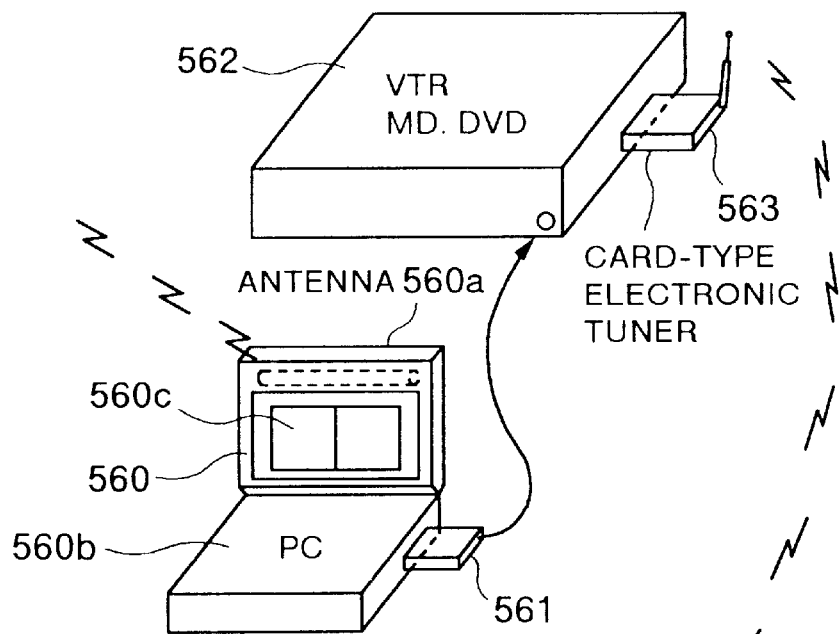
FIG. 19A is a diagram for explaining a card-type electronic tuner as applied to the amusement sector according to the fifth embodiment, and FIG. 19B a block diagram thereof.
Figure 19B:
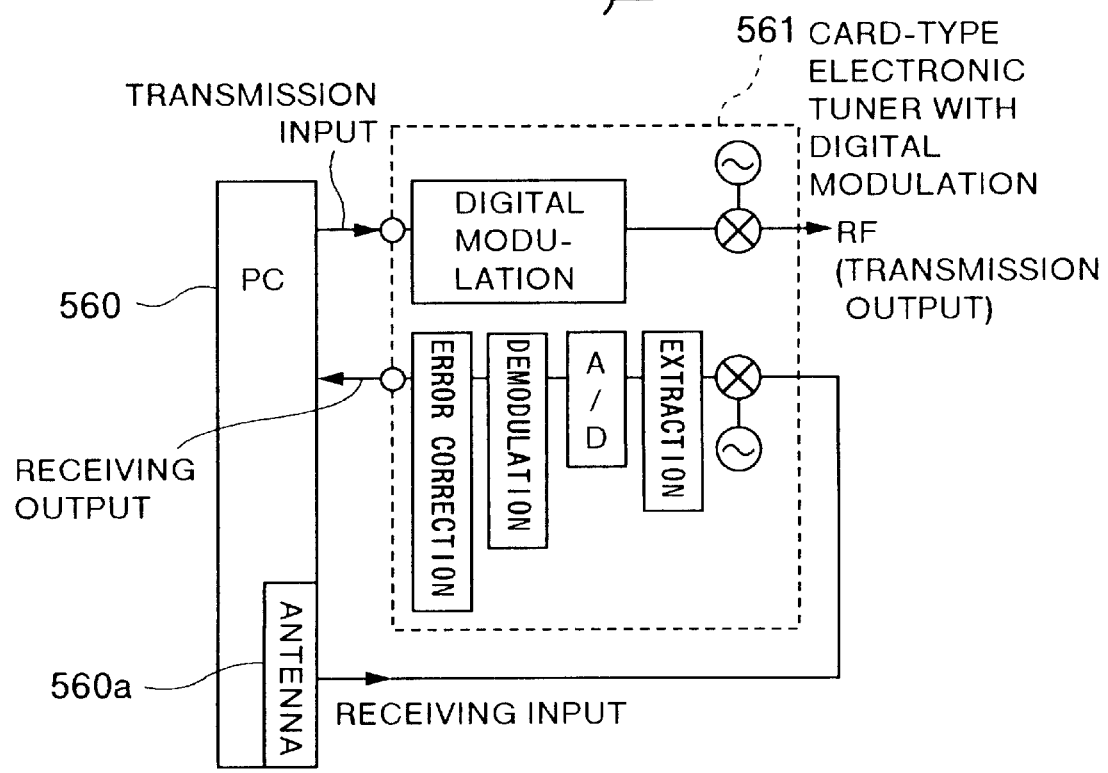

FIG. 19A shows an example of application as an amusement machine, and FIG. 19B a block diagram thereof. In FIG. 19A, numeral 560 designates a personal computer, and numeral 561 a bidirectional card-type electronic tuner inserted in the memory card insertion slot of the personal computer 560. The digital broadcasting wave from an external source is received by an antenna 560a provided in the personal computer 560. This information is processed by screen splitting or textual insertion using a keyboard 560b or a display 560c of the personal computer 560. The information thus processed is recorded by being received through the card-type electronic tuner 563 inserted in the memory slot of the VTR 562 (which may be replaced by a mini disk (MD), a digital video disk (DVD) or the like) by cable or radio from the signal input/output terminal 511 of the card-type electronic tuner. Also, the signal output from the card-type electronic tuner 561 may be printed in hard copy by means of printer or monitored by being transmitted to another personal computer or TV. Apart from the foregoing case in which the transmission output is in the direction opposite to the slot in FIGS. 19A and 19B, the signal may alternatively be transmitted from the antenna 560a in the personal computer 560 with the transmission output on the slot side.

Figure 20A:
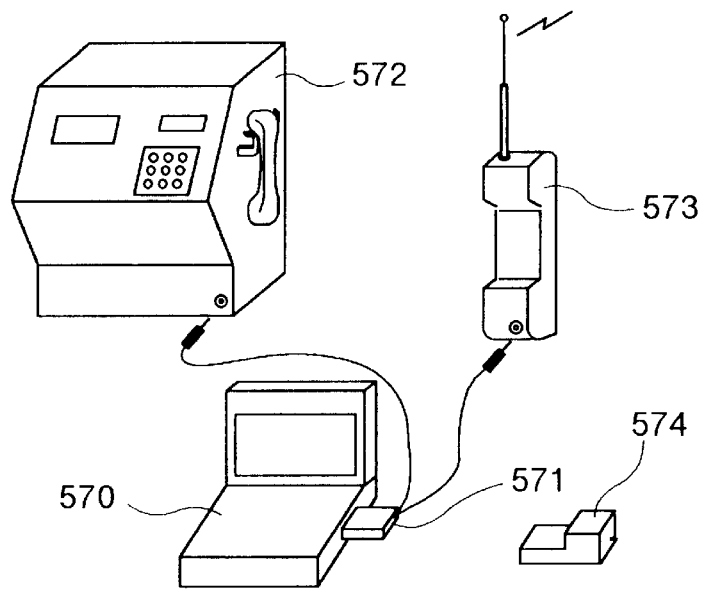
FIG. 20A is a diagram for explaining a card-type electronic tuner as applied to the business sector, and FIGS. 20B and 20C block diagrams thereof.
Figure 20B:
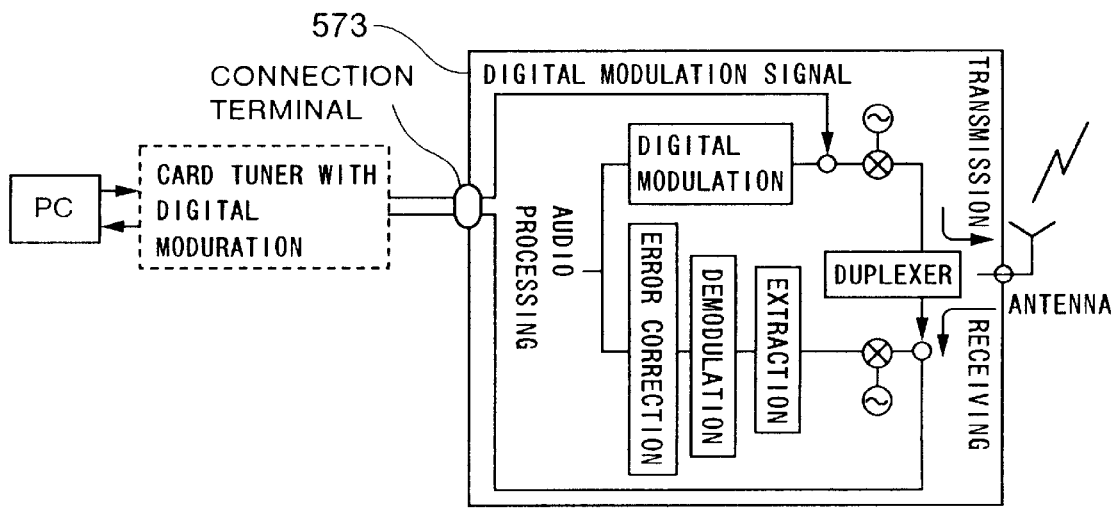
Figure 20C:
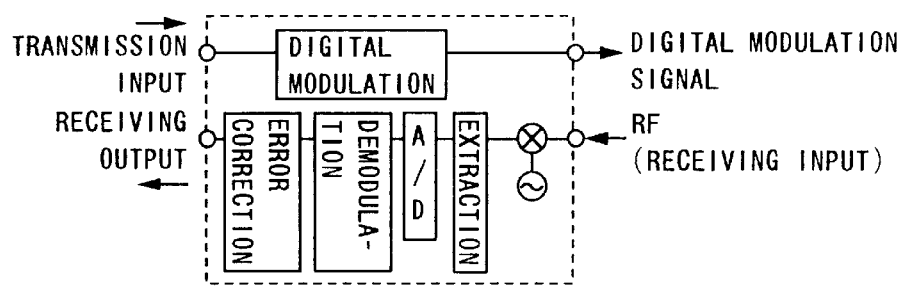

FIG. 20A shows an example of application to business, and FIGS. 20B and 20C block diagrams thereof.

In FIG. 20, numeral 570 designates a personal computer. A public telephone 572 or a portable telephone 573 is connected to a host computer in the head office using a bidirectional card-type electronic tuner 571 inserted in the personal computer 570 for processing business information generated by the user while on tour. In actual applications, data resident in the host computer is read and an estimate is submitted on the spot. If the negotiation is successful, a production order is issued directly to the host computer according to the received order.

With regard to the receiving operation, in view of the fact that a mixer and a local oscillator are already included in the card-type tuner, a digital portable telephone, if one is used, can be connected to the output of a duplexer as shown in the block diagram of FIG. 20B. When a digital public telephone is used, however, the mixer and the local oscillator for the card-type tuner shown in FIG. 20C are not required since transmission may be by baseband. In consideration of these facts, a change-over switch is provided in the card-type tuner for bypassing the mixer and the local oscillator as required, thereby making possible adaptation to both the digital portable telephone and the digital public telephone. Also, in some cases, the digital processing means of the receiving system in the card-type tuner may include either extraction means or an A/D converter but not both of them according to the frequency and transmission rate.

The mixer or the local oscillator in stages subsequent to the digital modulation processing means of the card-type tuner are not built in the transmission system. In other words, when the digital portable telephone is used, the output of the digital modulation processing means of the card-type tuner is supplied to the input of the mixer in the transmission system of the digital portable telephone through a connection terminal. When the digital public telephone is used, on the other hand, if baseband transmission is involved, the output from the digital modulation processing means of the card-type tuner is supplied directly.

For the channel of the digital public telephone into which ISDN is introduced, "0" and "1" information can be input and output directly as far as the protocol is consistent. In that case, the card-type tuner can be effectively used by adding appropriate protocol processing means and providing a change-over bypass switch for both the transmission and receiving systems. A configuration having a protrusion as designated by numeral 574 may be provided to meet the increased circuit requirements of the transmission system.

Figure 21A:
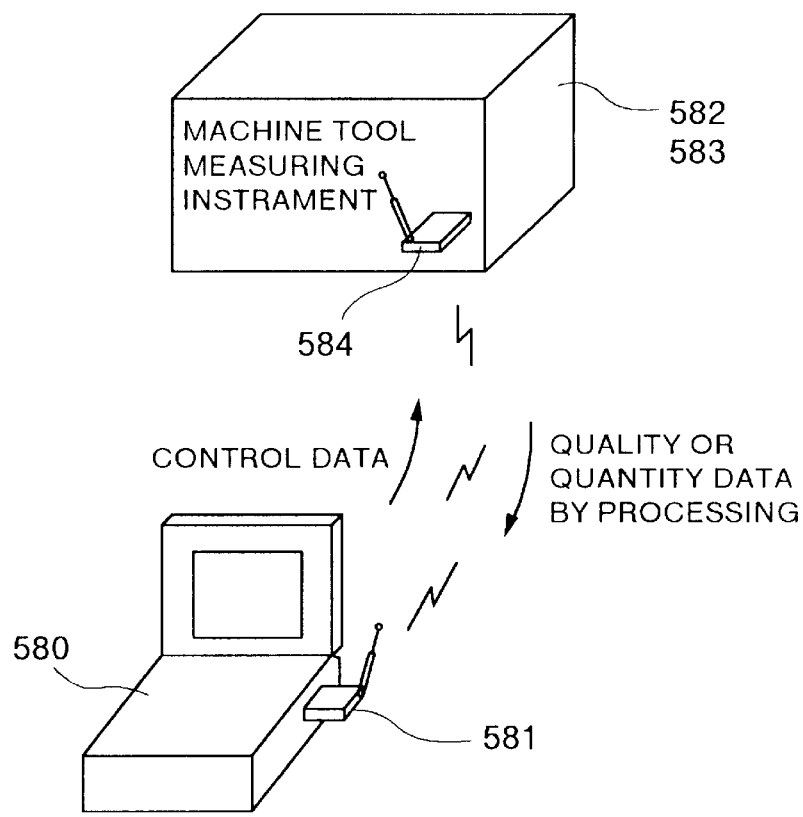
FIG. 21A is a diagram for explaining a card-type electronic tuner as applied to factory production or the like, and FIG. 21B a block diagram thereof.
Figure 21B:
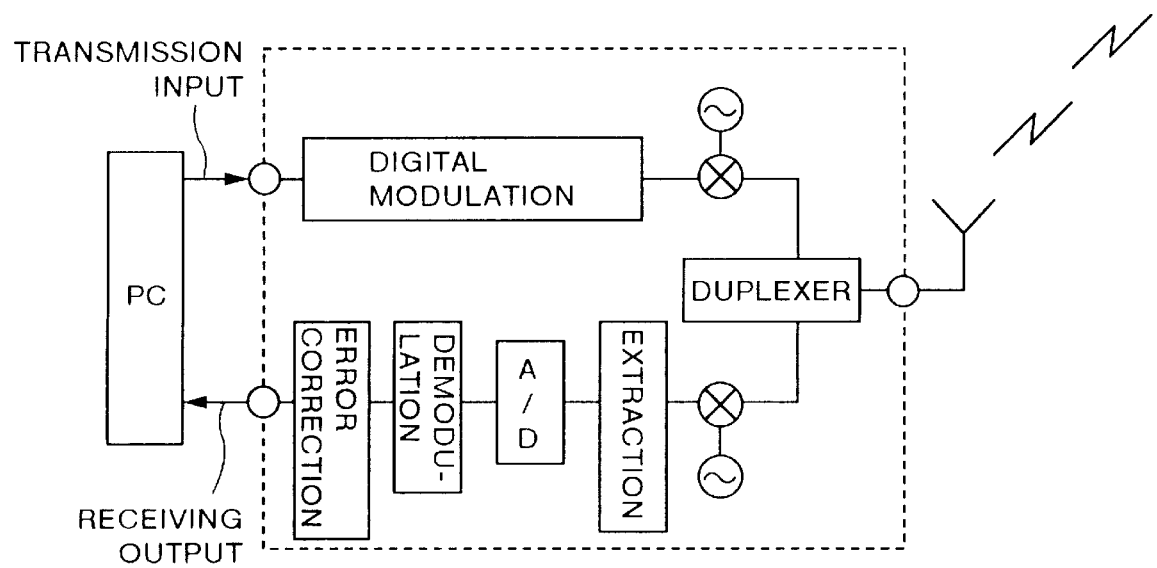

FIG. 21A shows an example used for factory production or the like, and FIG. 21B a block diagram thereof. In FIG. 21A, numeral 580 designates a personal computer. This personal computer 580 is used for controlling a machine tool 582 or a measuring instrument 583 located at a distance by means of a bidirectional card-type tuner 581. The information (yield, etc., for example) from the machine tool 582 or the measuring instrument 583 can be obtained from the bidirectional card-type tuner 584 inserted in the particular machine tool or the measuring instrument, as the case may be. In this case, both the transmission and receiving systems have a mixer and a local oscillator.

Figure 22:
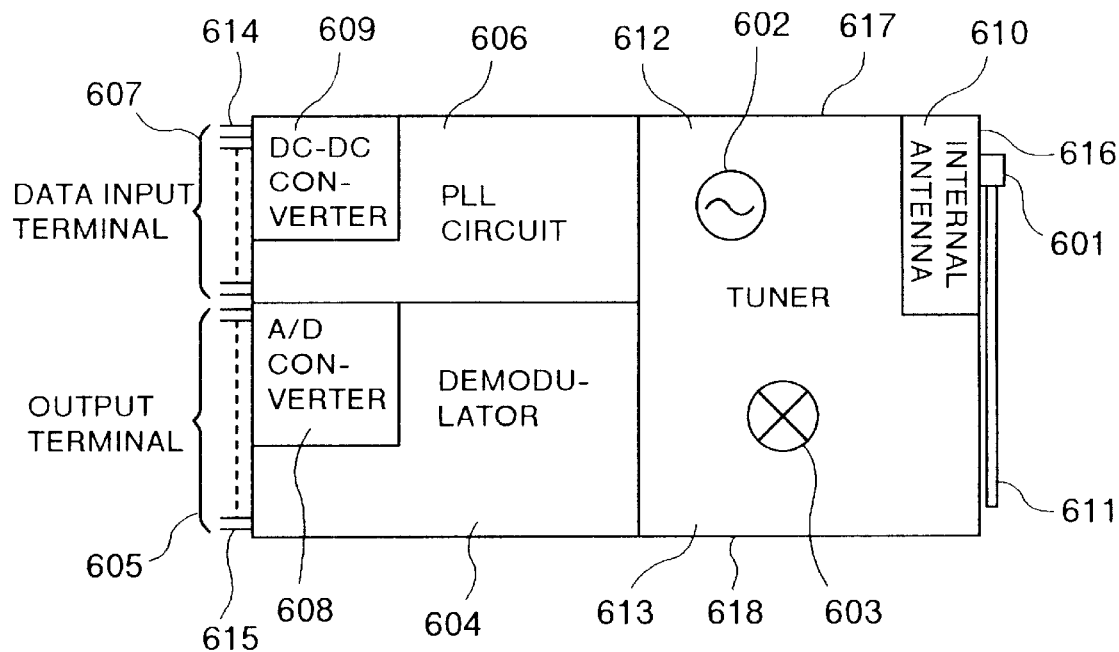
FIG. 22 is a diagram showing a circuit layout for a card-type electronic tuner according to a sixth embodiment of the invention.
Figure 23:
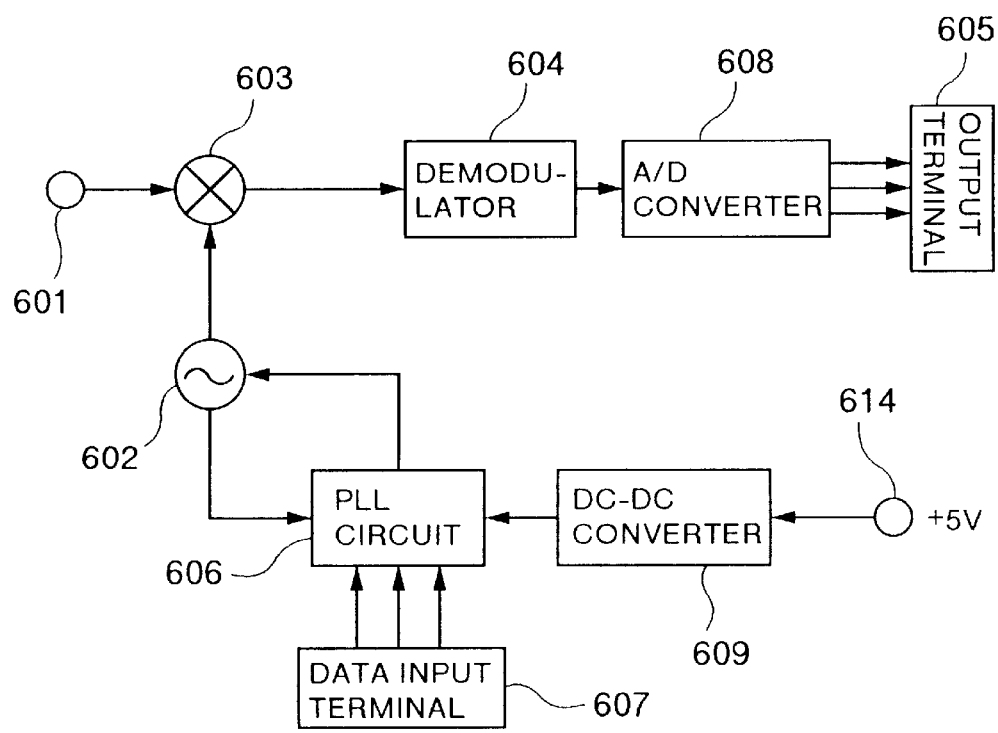
FIG. 23 is a block diagram of a card-type electronic tuner according to the sixth embodiment.

FIG. 22 is plan view showing a card-type tuner according to a sixth embodiment of the invention, and FIG. 23 is a block diagram thereof.

This embodiment will be explained with reference to FIGS. 22 and 23. First, in FIG. 22, an electronic tuner according to the invention comprises a signal input terminal 601, a mixer 603 having an input thereof supplied with the signal from the signal input terminal 601 and the other input terminal thereof supplied with the output of a local oscillator 602, a demodulator 604 supplied with the output of the mixer 603, an A/D converter 608 supplied with the output of the demodulator 604, an output terminal 605 supplied with the output of the A/D converter 608, and a PLL circuit 606 connected to a data input terminal 607 for controlling the oscillation frequency of the local oscillator 602, all of which are accommodated in a card-type case 613 shown in the drawing. The output terminal 605, the data input terminal 607 and the power input terminal 614 are arranged on one lateral side 615 of the case 613, while the signal input terminal 601 is disposed on the other lateral side 616 of the case 613. By doing so, when the card 613 is inserted with the lateral side 615 thereof first into the apparatus, the other lateral side 616 can be exposed out of the apparatus. As a result, the provision of the signal input terminal 601 at the exposed part makes it possible to introduce a high-frequency signal to the signal input terminal 601 without the need of reconstruction of the apparatus. Also, the longitudinal side 617 or 618 in the vicinity of the other lateral side 616 of the case 613 may be exposed from the apparatus to allow the signal input terminal 601 to be arranged on the exposed longitudinal side 617 or 618.

A defined section for accommodating a tuner 612 including the mixer 603 and the local oscillator 602 is arranged in the vicinity of the input terminal 601. A defined section for the PLL circuit 606 is provided between the tuner 612, the data input terminal 609 on the lateral side 615 and the longitudinal side 617. A DC-DC converter 609 is packaged in the vicinity of the power input terminal 614. In this way, provision is made to isolate the digital signal system and the high-frequency signal system from each other as far as possible.

Also, a section for the demodulator 604 is defined between the tuner 612, the output terminal 605 on the lateral side 615 and the longitudinal side 618.

An A/D converter 608 is arranged in proximity to the output terminal 605.

An audio multiplexing circuit is inserted between the demodulator 604 and the output terminal 605, and is arranged in the vicinity of the output terminal 605. This is in order to enjoy stereo broadcasting.

An antenna system is arranged in the vicinity of the signal input terminal 601 and the other lateral side 616. In other words, an internal antenna 610 is mounted within the case 613, and is connected to the signal input terminal 601. Also, the antenna 610 is arranged in the vicinity of the signal input terminal 601. In the case where the antenna 610 is accommodated in the case 613 in this fashion, the receiving operation is possible without an external antenna. In this case, the tuner 612 configured of the mixer 603 and the local oscillator 602 is arranged in the vicinity of the signal input terminal 601. The PLL circuit 606 and the demodulator 604 are separated by a metal partitioning plate. The PLL circuit 606 is arranged adjacently to the data input terminal 607 thereby to prevent the digital signal such a clock from having an effect on the tuner 612.

Further, the demodulator 604 is arranged in the vicinity of the output terminal 605, and the A/D converter 608 is connected between the demodulator 604 and the output terminal 605. This A/D converter 608 is inserted between the demodulator 604 and the output terminal 605.

The power supply uses the DC-DC converter 609 in order to secure a single power supply. This DC-DC converter 609 is connected to the power input terminal 614. The output of the DC-DC converter 609 is connected to a tuning voltage generator circuit of the PLL circuit 600 thereby to produce a tuning voltage to be supplied to the local oscillator 602. In addition, power is converted into the required voltage from the power input terminal 614 and supplied to the mixer 603, the local oscillator 602, the demodulator 604, the A/D converter 608, etc.

Next, an embodiment of the antenna 611 will be described. First, a bar antenna is used and arranged substantially in parallel to the lateral sides of the card.

Alternatively, a rod antenna may be used on the outside of the card 613 on the lateral side 616.

As still another alternative, a tabular antenna 611 may be used with the shorter side thereof having a crescent section. This is what is called in the shape of the measuring scale.

The operation of a card-type tuner configured as described above will be explained.

The television video and audio signals supplied by way of the signal input terminal 601 through the antenna 610 or 611 are applied to the tuner 612 including the mixer 603 and the local oscillator 602 for selecting the desired channel. The video signal demodulated by the demodulator 604 is applied to the A/D converter 608 for Y-C separation, with the resulting RGB output being applied directly on the screen of the apparatus. The audio signal, on the other hand, can be directly output from the speaker of the apparatus.

As described above, according to this embodiment, a card-type electronic tuner of the invention is inserted into the apparatus such as the personal computer or the video movie, so that the television picture and sound can be received without connecting any special terminal as a signal input terminal in the apparatus.

More specifically, a card-type electronic tuner according to this embodiment comprises the output terminal 605 and the data input terminal 607 arranged on one lateral side 615, while the signal input terminal 601 is arranged on the other lateral side 616 or on the longitudinal side 617 in the vicinity of the lateral side 616 of the case 613. Thus the television signal can be directly connected to the signal input terminal 601 without the need of providing a signal input terminal in the apparatus.

Also, the antenna 610 is connected to the signal input terminal 601 and is accommodated in the case 613 provided in the vicinity of the signal input terminal 601. As a result, in a region with a strong electric field, the television picture and sound and the AM radio broadcasting can be received without the trouble of using an external antenna. Since the antenna 610 is accommodated in the case 613, the antenna is readily protected while not in use.

In view of the fact that the tuner 612 is arranged in the vicinity of the signal input terminal 601, the television signal supplied by way of the signal input terminal 601 can be minimized in input level attenuation. Further, the signals other than for the desired channel can be prevented from interfering with other circuits such as the demodulator 604 at the time of receiving.

In the case where the antenna 610 is configured of a bar antenna integrated substantially in parallel to the lateral side 616 of the card 613, the AM radio broadcasting can be received without using an external antenna with a highly-sensitive signal being supplied to the mixer 603.

If an external rod antenna is used as the antenna 611 outside of the card 613, on the other hand, the TV picture and sound can be received with a highly-sensitive television signal being supplied to the mixer 603.

Also, assuming that the antenna 611 is shaped in tabular form with the shorter side thereof having a crescent section in what may be called the measuring scale style, the antenna 611 is improved in accommodability and can be readily protected when not in use. This permits the receiving of the television video and audio signals of a quality equivalent to that with the rod antenna, with the result that a highly-sensitive signal can be supplied to the mixer 603.

In view of the fact that the PLL circuit 606 is provided adjacently to the data input terminal 607, radiation of control signals including the clock signal, data signal and the enable signal from the data input terminal 607 is minimized. Also, the interference from other oscillation circuits with the control signal line can be prevented.

The arrangement of the demodulator 604 in the vicinity of the output terminal 605, on the other hand, minimizes the interference of high harmonics from other circuits such as the oscillation circuit 602 with the video and audio signals after demodulation.

Also, the provision of the A/D converter 608 between the demodulator 604 and the output terminal 605 within the case 613 makes it possible to output the television picture directly on the display of the apparatus without arranging any A/D converter 608 on the apparatus side. As a consequence, the load on the apparatus can be reduced without the need of providing the A/D converter 608 on the apparatus. Also, the interference of high harmonics or the like with the video signal after demodulation can be minimized since the circuits involved are some distance away from the oscillation circuit 602. Further, the adjacency between the A/D converter 608 and the output terminal 605 reduces to a minimum the interference of high harmonics from other circuits such as the oscillation circuit 602 with the A/D-converted signal.

Finally, in view of the fact that the DC-DC converter 609 is connected to the power input terminal 614 while the output of the DC-DC converter 609 is connected to the PLL circuit 606, the DC power (30 volts) generated by the DC-DC converter 609 is immune to noises from other circuits, thereby providing a stable power supply. Also, since the DC-DC converter 609 is built in the apparatus, there is no need of providing the DC-DC converter 609 in the apparatus. The load on the apparatus thus can be reduced.

Figure 24:
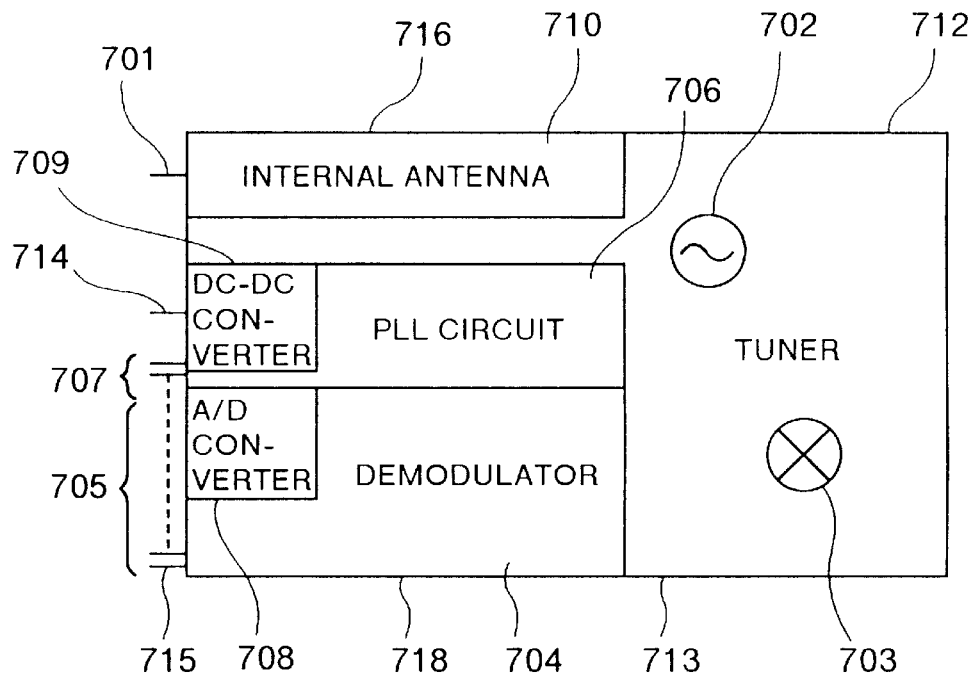
FIG. 24 is a diagram showing a circuit layout for a card-type electronic tuner according to a seventh embodiment.
Figure 25:
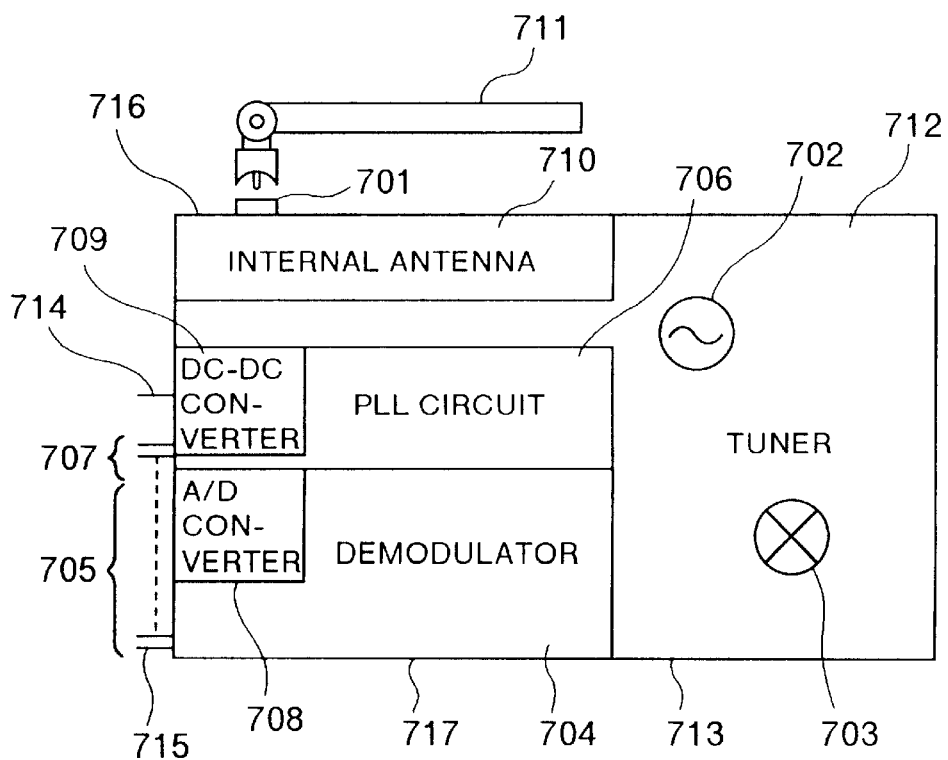
FIG. 25 is a diagram showing another circuit layout according to the seventh embodiment of the invention.
Figure 26:
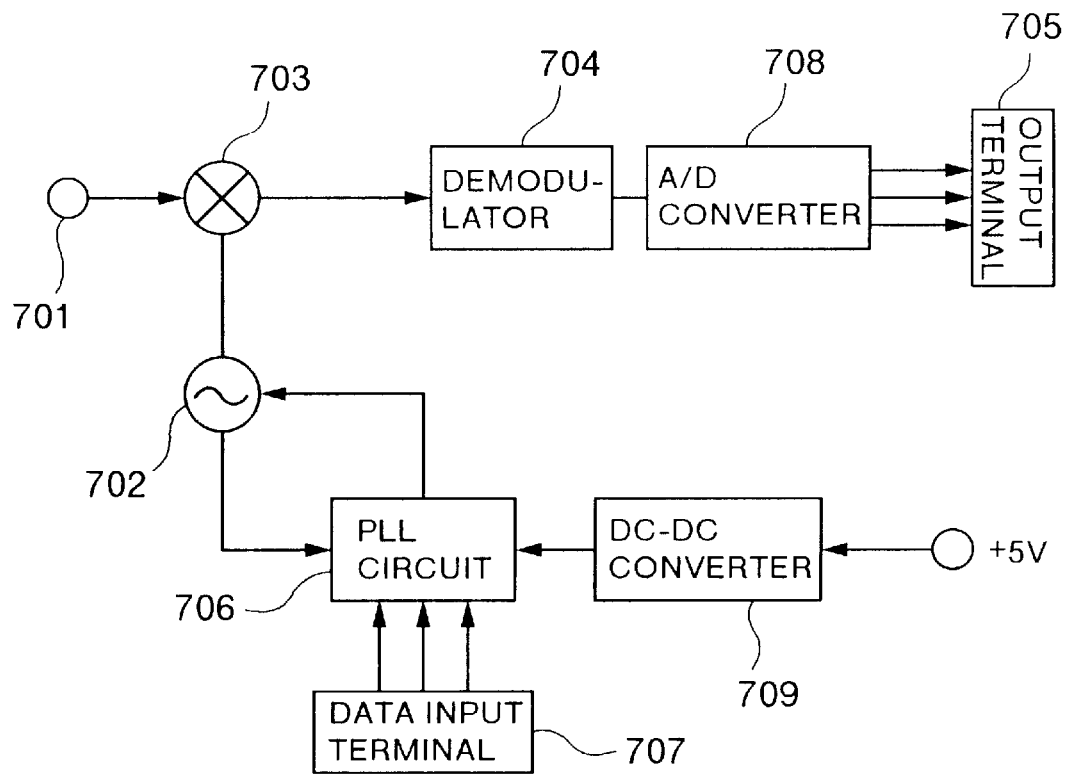
FIG. 26 is a block diagram of the seventh embodiment.

FIGS. 24 and 25 show a circuit layout of a card-type electronic tuner according to a seventh embodiment of the invention, and FIG. 26 is a block diagram of the same embodiment.

A card-type electronic tuner according to the present invention will be explained with reference to FIGS. 24, 25 and 26. First, in FIGS. 24 and 26, an electronic tuner according to the invention comprises a signal input terminal 701, a mixer 703 having an input supplied with the signal from the signal input terminal 701 and the other input terminal supplied with the output from a local oscillator 702, a demodulator 704 supplied with the output from the mixer 703, an A/D converter 708 supplied with the output from the demodulator 704, an output terminal 705 supplied with the output from the A/D converter 708, a PLL circuit 706 connected to the data input terminal 707 for controlling the oscillation frequency of the local oscillator 702, and a DC-DC converter 709 connected to the power input terminal 714 for supplying a tuning voltage to the PLL circuit 706. All of these component parts are accommodated in a card-type case 713 shown in the drawing. The output terminal 705, the data input terminal 707 and the power input terminal 714 are arranged on one lateral side 715 of the case 713, while the signal input terminal 701 is disposed on the lateral side 715 of the case 713 or on the longitudinal side 716 in the vicinity of the lateral side 715 thereof.

As a result, when the card 713 is inserted with the one lateral side 715 thereof first into the apparatus proper 720 (FIG. 27), according to the embodiment shown in Fig.24, a high-frequency signal can be introduced directly into the signal input terminal 701 from a dedicated connector provided for the card-type electronic tuner such-as in a TV camera.

Figure 27:
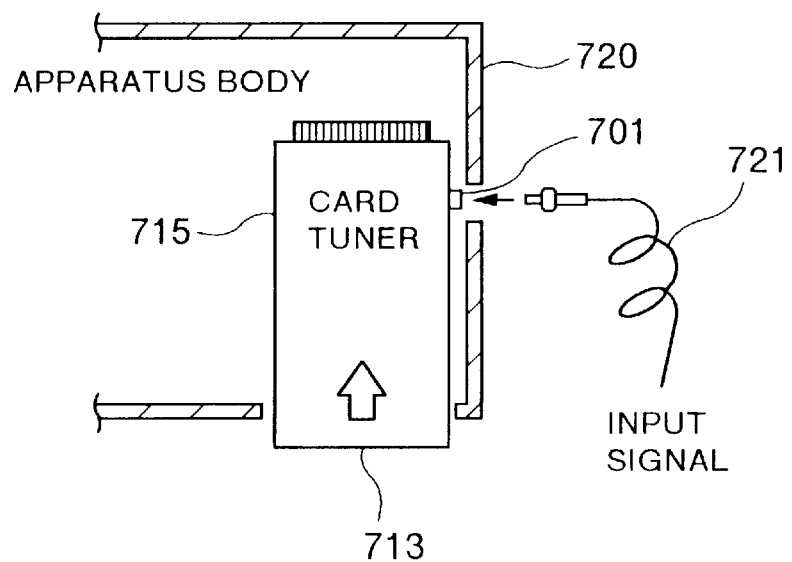
FIG. 27 is a sectional view showing the essential parts of the same embodiment.
Figure 28:
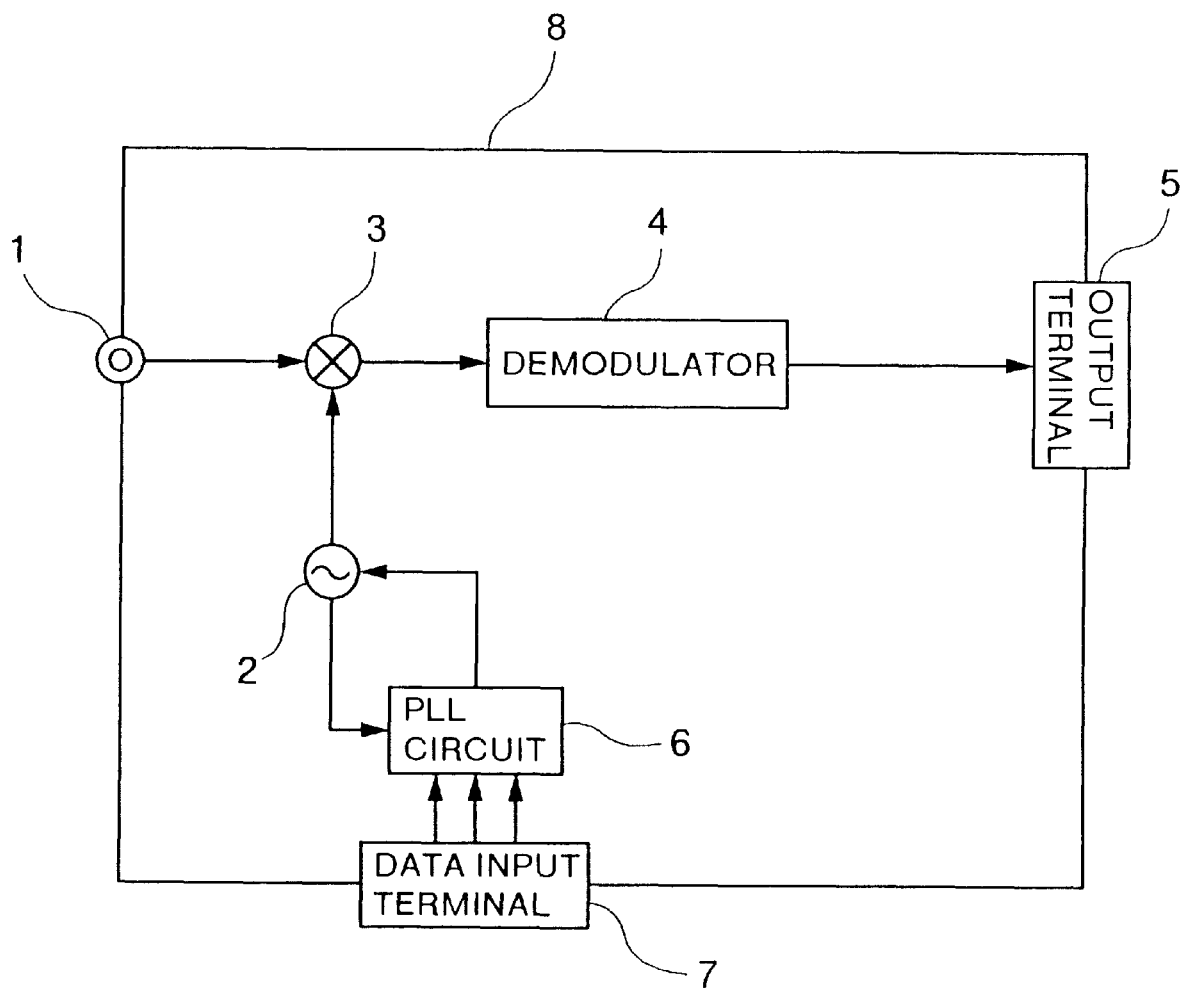
FIG. 28 is a block diagram showing a conventional card-type electronic tuner.

According to the embodiment shown in FIG. 25, on the other hand, the apparatus proper 720 need not be reconstructed with respect to the general-purpose connector for the personal computer, and as shown in FIG. 27, a high-frequency signal can be introduced into the signal input terminal 701 from the side of the apparatus 720.

Sections defined for the internal antenna 710 and the tuner 712 including the mixer 703 and the local oscillator 702 in that order are arranged from the longitudinal side 716. A section is defined for the PLL circuit 706 adjacently to the tuner 712 between the lateral side 715 and the data input terminal 707. The DC-DC converter 709 is packaged in the vicinity of the power input terminal 714.

A section for the demodulator 704 is defined between the tuner 712, the output terminal 705 of the lateral side 715 and the other longitudinal side 717. The A/D converter 708 is arranged in the vicinity of the output terminal 705.

An audio multiplexing circuit may be inserted between the demodulator 704 and the output terminal 705 and may be arranged in the vicinity of the output terminal 705. This is for the purpose of enjoying the stereo broadcasting. A signal input terminal 701 is provided as an antenna input on the lateral side 715 or on the longitudinal side 716 in the vicinity of the lateral side 715. An internal antenna 710 is mounted in the case 713 and connected to the signal input terminal 701. Also, an antenna 710 is arranged in the vicinity of the signal input terminal 701. In the case where the antenna 710 is accommodated in the case 713 in this fashion, the receiving operation is possible without an external antenna.

The tuner 712 is separated from the PLL circuit 706 and the demodulator 704 by a metal partitioning plate. The PLL circuit 706 is provided adjacently to the data input terminal 707 in order to prevent the digital signal such a clock from affecting the tuner 712.

Further, the demodulator 704 is arranged in the vicinity of the output terminal 705, and the A/D converter 708 is interposed between the demodulator 704 and the output terminal 705. The A/D converter 708 in turn is arranged between the demodulator 704 and the output terminal 705.

The power supply uses the DC-DC converter 709 to provide a single power supply. The DC-DC converter 709 is connected to the power input terminal 715. The output of this DC-DC converter 709, on the other hand, is connected to the tuning voltage generator circuit of the PLL circuit 706 to produce a tuning voltage to be supplied to the local oscillator 702. In addition, the power supplied from the power input terminal 714 is converted into the required voltage, and is supplied to the mixer 703, the local oscillator 702, the demodulator 704, the A/D converter 709, etc.

Now, the manner in which the antenna is embodied will be explained. First, a bar antenna may be used and arranged substantially in parallel to the longitudinal side 716 of the case 713.

Alternatively, a rod antenna 711 may be used and mounted on a signal input terminal external to the case 713 on the longitudinal side 710.

An antenna cable 721 may of course be inserted in place of the rod antenna 711. A plan view of the essential parts representing this usage is shown in the drawing.

The operation of a card-type electronic tuner configured in the manner mentioned above will be described below.

The television video and audio signals supplied from the signal input terminal 701 through the internal antenna 710 or the external rod antenna 711 are applied to the tuner 712 including the mixer 703 and the local oscillator 702 thereby to select the desired channel. Next, the video signal is demodulated by the demodulator 704, and the resulting demodulated video signal is subjected to YC separation at the A/D converter 708 followed by being applied directly to the screen of the apparatus as an RGB output. The audio signal may be produced directly from the speaker of the apparatus.

As described above, according to the embodiment shown, a card-type electronic tuner according to the invention is inserted into the apparatus proper such as a personal computer or a video camera to receive the TV picture and sound. Also, according to the embodiment shown in FIG. 25, the receiving operation is possible without providing the signal input terminal 1 as a special terminal on the apparatus side.

The antenna 710 is connected to the signal input terminal 701, arranged in the vicinity of the signal input terminal 701 and accommodated in the case 713. As a result, the television video and audio signals and the AM radio broadcasting can be received without taking trouble of using a separate external antenna in a region with strong electric field. Further, since the antenna 710 is accommodated in the case 713, the antenna can be readily protected while not in use.

With the tuner 712 arranged in the vicinity of the signal input terminal 701, the attenuation of the input level of the television signal supplied through the signal input terminal 701 can be minimized. Further, signals other than for the desired channel are prevented from interfering with other circuits such as the demodulator 704 at the time of receiving.

If the antenna 710 is configured of a bar antenna integrated substantially in parallel to the longitudinal side 716 of the case 713, the AM radio broadcasting can be received without using an external antenna. A highly sensitive signal can thus be supplied to the mixer 703.

As shown in the drawing, the use of an external rod antenna 711 external to the case 713 permits the television picture and sound to be received, and thus a highly-sensitive television signal can be supplied to the mixer 3.

Also, assuming that the rod antenna 711 is of replaceable type, an antenna not in use is easy to protect.

In view of the fact that the PLL circuit 706 is provided adjacently to the data input terminal 707, radiation of control signals including the clock signal, data signal and the enable signal from the data input terminal 707 can be minimized. Further, interferences of other oscillation circuits with the control signals can be prevented.

The demodulator 704 is arranged in the vicinity of the output terminal 705, and therefore the interference of harmonics from other circuits including the local oscillation circuit 702 with the video and audio signals after demodulation is minimized.

Since the A/D converter 708 is inserted between the output terminal 705 and the demodulator 704 in the case 713, the television picture can be output directly to the display unit of the apparatus without arranging the A/D converter 708 on the apparatus. As a result, it is not necessary to provide the A/D converter 708 in the apparatus thereby reducing the load imposed on the apparatus. Further, since the video signal after demodulation is distant from the local oscillation circuit 702, the interference from harmonics or the like can be minimized. Furthermore, the A/D converter 708 and the output terminal 705 being located adjacently to each other reduces the interference of harmonics or the like with the signal after A/D conversion from other circuits including the local oscillation circuit 702.

Finally, in view of the fact that the DC-DC converter 709 is connected to the power input terminal 714 and the output of the DC-DC converter 709 is connected to the PLL circuit 706 in the vicinity thereof, noises from other circuits are prevented from interfering with the DC power (30 volts) generated by the DC-DC converter 709, thereby providing a stable power supply. Further, due to the built-in construction of the DC-DC converter 709, there is no need of providing the DC-DC converter 709 in the apparatus, thereby reducing the load on the apparatus.

It will thus be understood from the foregoing description that according to the present invention there is provided a card-type electronic tuner comprising a signal input terminal supplied with a high-frequency signal, a mixer having an input terminal supplied with the signal from the signal input terminal and the other input terminal supplied with the output from a local oscillator, an output terminal supplied with the output signal from the mixer, a PLL circuit having an input terminal connected to the output of the local oscillator and a PLL signal output terminal connected to the input terminal of the local oscillator, and a data input terminal for supplying a data signal to the PLL circuit, all of which are accommodated in a card-type case. The output terminal and the data input terminal are arranged on one lateral side of the case, while digital signal processing means including extraction means and/or an A/D converter is inserted between the mixer and the output terminal. The digital broad-casting therefore can be received directly and the data thereof can be introduced into the personal computer or the like.

Further, since the card-type electronic tuner under consideration is in the form of card, the expansion slot for the memory card can be used as it is without any modification or reconstruction of the hardware of the personal computer.

What is claimed is:

1. A card-type electronic device for optional use without hardware modification of an apparatus by insertion into said apparatus, said device comprising:
(a) a receiving system for selecting a desired channel from a digitally modulated signal, including:
a signal input terminal supplied with a high-frequency signal;
a mixer having an input port supplied with a signal from the signal input terminal and another input port for receiving an output of a local oscillator;

an output terminal supplied with an output signal of the mixer;

a PLL circuit having an input port for receiving the output of the local oscillator and a PLL signal output port for connection to an input of the local oscillator;

a DC-DC converter connected to a power input terminal, an output of said DC-DC converter being connected to said PLL circuit so as to reduce a load on said apparatus in obtaining a tuning voltage;

a data input terminal for supplying a data signal to said PLL circuit; and a digital signal processing means including at least one of an extraction means for performing a frequency conversion to extract a signal containing information of an absolute value from a carrier wave in a digitally-modulated output signal from said mixer and for use in digital signal processing of the extracted signal and an A/D converter connected between the mixer and the output terminal;

wherein said mixer and said local oscillator are arranged in a vicinity of said signal input terminal so as to minimize input level attenuation;

(b) a transmitting system for digitally modulated signal including:

a transmission signal input terminal;

digital modulation processing means connected to said transmission signal input terminal; and a transmission signal output terminal coupled to said digital modulation processing means; and (c) a card-type case having a protrusion to meet an increased circuit requirement, said receiving system and said transmitting system being packed in said card-type case;

wherein said output terminal, said data input terminal, said power input terminal and said transmission signal input terminal are arranged on a lateral side of said case, and wherein said signal input terminal and said transmission signal output terminal are coupled to a duplexer connected to a single signal input/output terminal so as to prevent an output signal from said digital modulation processing means from circumventing into the receiving system.

2. A card-type electronic device according to claim 1, wherein the single input/output terminal is arranged on one of a lateral side of the case and a longitudinal side of the case, and the data input terminal is mounted on a lateral side of the case.

3. A card-type electronic device according to claim 1, wherein the single input/output terminal is arranged one of (i) opposite to and (ii) in a vicinity of the lateral side of the case on which the data input terminal is mounted.

4. A card-type electronic device according to claim 1, further comprising a printed board disposed in said case and wherein the PLL circuit is arranged on one side of said printed board, the digital signal processing means is arranged on the other side of said printed board, and said PLL circuit and said digital signal processing means are spaced apart on said printed board.

5. A card-type electronic device according to claim 1, further comprising a partitioning plate mounted between the digital signal processing means and the PLL circuit on the printed board.

6. A card-type electronic device according to claim 1, further comprising one of a two-sided printed board and a multilayer printed board packaged in the case, and wherein the PLL circuit is arranged on one side of the two-sided printed board or the multilayer printed board and the digital signal processing means is arranged on the other side of said one of the two-sided printed board and the multilayer printed board.

7. A card-type electronic device according to claim 1, further comprising a first printed board having the PLL circuit arranged thereon and a second printed board having the digital signal processing means arranged thereon, said first and second printed boards being accommodated in the case.

8. A card-type electronic device for optional use without hardware modification of an apparatus by insertion into said apparatus, said device comprising:

(a) a receiving system for selecting a desired channel from a digitally modulated signal, including:

a signal input terminal supplied with a high-frequency signal;

a mixer having an input port supplied with a signal from said signal input terminal and another input port for receiving an output signal from a local oscillator;

extraction means for performing a frequency conversion to extract a signal containing information of an absolute value from a carrier wave in a digitally-modulated output signal from said mixer and for use in digital signal processing of the extracted signal;

an A/D converter supplied with the output signal of said extraction means;

a demodulator supplied with the output signal of said A/D converter;

an output terminal supplied with an output from said demodulator;

a PLL circuit having an input port for receiving an output of said local oscillator and a PLL signal output port for connection to an input port of said local oscillator;

a DC-DC converter connected to a power input terminal, an output of said DC-DC converter being connected to said PLL circuit so as to reduce a load on said apparatus in obtaining a tuning voltage; and a data input terminal for supplying a data signal to said PLL circuit;

wherein said mixer and said local oscillator are arranged in a vicinity of said signal input terminal so as to minimize input level attenuation;

(b) a transmitting system for digitally modulated signal including:

a transmission signal input terminal;

digital modulation processing means connected to said transmission signal input terminal; and a transmission signal output terminal coupled to said digital modulation processing means;

(c) a card-type case having a protrusion to meet an increased circuit requirement, said receiving system and said transmitting system being packed in said card-type case;

wherein said output terminal, said data input terminal, said power input terminal and said transmission signal input terminal are arranged on a lateral side of said case, and wherein said signal input terminal and said transmission signal output terminal are coupled to a duplexer connected to a single signal input/output terminal so as to prevent an output signal from said digital modulation processing means from circumventing into the receiving system.

9. A card-type electronic device for optional use without hardware modification of an apparatus by insertion into said apparatus, said device comprising:

(a) a receiving system for selecting a desired channel from a digitally modulated signal, including:
 a signal input terminal supplied with a high-frequency signal;
 a mixer having an input port supplied with a signal from said signal input terminal and another input port for receiving an output signal from a local oscillator;
 extraction means for performing a frequency conversion to extract a digital signal from a carrier wave in a digitally-modulated output signal from said mixer and for use in digital signal processing of the extracted signal;
 a demodulator supplied with an output signal of said extraction means;
 an output terminal supplied with an output of said demodulator;
 a PLL circuit having an input port for receiving an output of said local oscillator and a PLL signal output port for connection to an input port of said local oscillator;
 a DC-DC converter connected to a power input terminal, an output of said DC-DC converter being connected to said PLL circuit so as to reduce a load on said apparatus in obtaining a tuning voltage; and
 a data input terminal for supplying a data signal to said PLL circuit;
 wherein said mixer and said local oscillator are arranged in a vicinity of said signal input terminal so as to minimize input level attenuation;
(b) a transmitting system for digitally modulated signal including:
 a transmission signal input terminal;
 digital modulation processing means connected to said transmission signal input terminal; and
 a transmission signal output terminal coupled to said digital modulation processing means;
(c) a card-type case having a protrusion to meet an increased circuit requirement, said receiving system and said transmitting system being packed in said card-type case;
wherein said output terminal, said data input terminal, said power input terminal and said transmission signal input terminal are arranged on a lateral side of said case, and wherein said signal input terminal and said transmission signal output terminal are coupled to a duplexer connected to a single signal input/output terminal so as to prevent an output signal from said digital modulation processing means from circumventing into the receiving system.

10. A card-type electronic device for optional use without hardware modification of an apparatus by insertion into said apparatus, said device comprising:
(a) a receiving system for selecting a desired channel from a digitally modulated signal, including:
 a signal input terminal supplied with a high-frequency signal;
 a mixer having an input port supplied with a signal from said signal input terminal and another input port for receiving an output signal from a local oscillator;
 an A/D converter supplied with an output signal from said mixer;
 a demodulator supplied with an output signal from said A/D converter;
 an output terminal supplied with an output from said demodulator;
 a PLL circuit having an input port for receiving an output of said local oscillator and a PLL signal output port for connection to an input port of said local oscillator;
 a DC-DC converter connected to a power input terminal, an output of said DC-DC converter being connected to said PLL circuit so as to reduce a load on said apparatus in obtaining a tuning voltage; and
 a data input terminal for supplying a data signal to said PLL circuit;
 wherein said mixer and said local oscillator are arranged in a vicinity of said signal input terminal so as to minimize input level attenuation;
(b) a transmitting system for digitally modulated signal including:
 a transmission signal input terminal;
 digital modulation processing means connected to said transmission signal input terminal; and
 a transmission signal output terminal coupled to said digital modulation processing means;
(c) a card-type case having a protrusion to meet an increased circuit requirement, said receiving system and said transmitting system being packed in said card-type case;
wherein said output terminal, said data input terminal, said power input terminal and said transmission signal input terminal are arranged on a lateral side of said case, and wherein said signal input terminal and said transmission signal output terminal are coupled to a duplexer connected to a single signal input/output terminal so as to prevent an output signal from said digital modulation processing means from circumventing into the receiving system.

11. A card-type electronic device according to claim 8, 9, 10, further comprising an error correction circuit inserted between said demodulator and said output terminal.

12. A card-type electronic device for optional use without hardware modification of an apparatus by insertion into said apparatus, said device comprising:
(a) a receiving system for selecting a desired channel from a digitally modulated signal, including:
 a signal input terminal supplied with a high-frequency signal;
 a first mixer having an input port supplied with a signal from said signal input terminal and another input port for receiving an output of a first local oscillator;
 a second mixer having an input port supplied with an output signal of said first mixer and another input port for receiving an output of a second local oscillator;
 an output terminal supplied with an output signal from said second mixer;
 a PLL circuit having an input port for receiving the output of said first local oscillator and a PLL signal output port for connection to an input port of said first local oscillator;
 a DC-DC converter connected to a power input terminal, an output of said DC-DC converter being connected to said PLL circuit so as to reduce a load on said apparatus in obtaining a tuning voltage;
 a data input terminal for supplying a data signal to said PLL circuit; and
 a digital signal processing means including at least one of an extraction means for performing a frequency conversion to extract a digital signal from a carrier wave in a digitally-modulated output signal from said second mixer and for use in a digital signal processing of the extracted signal and an A/D converter connected between said second mixer and said output terminal;

wherein said mixer and said local oscillator are arranged in a vicinity of said signal input terminal so as to minimize input level attenuation;

(b) a transmitting system for digitally modulated signal including:
  a transmission signal input terminal;
  digital modulation processing means connected to said transmission signal input terminal; and
  a transmission signal output terminal coupled to said digital modulation processing means;

(c) a card-type case having a protrusion to meet an increased circuit requirement, said receiving system and said transmitting system being packed in said card-type case;

wherein said output terminal, said data input terminal, said power input terminal and said transmission signal input terminal are arranged on a lateral side of said case, and wherein said signal input terminal and said transmission signal output terminal are coupled to a duplexer connected to a single signal input/output terminal so as to prevent an output signal from said digital modulation processing means from circumventing into the receiving system.

13. A card-type electronic device for optional use without hardware modification of an apparatus by insertion into said apparatus, said device comprising:

(a) a receiving system for selecting a desired channel from a digitally modulated signal, including:
  a signal input terminal supplied with a high-frequency signal;
  a mixer having an input port supplied with a signal from said signal input terminal and another input port for receiving an output signal from a local oscillator;
  a demodulator supplied with an output signal from said mixer;
  a data input terminal;
  an output terminal supplied with an output signal from said demodulator;
  a PLL circuit connected to a data input terminal for controlling an oscillation frequency of said local oscillator; and
  a DC-DC converter connected to a power input terminal, an output of said DC-DC converter being connected to said PLL circuit so as to reduce a load on said apparatus in obtaining a tuning voltage;

wherein said mixer and said local oscillator are arranged in a vicinity of said signal input terminal so as to minimize input level attenuation;

(b) a transmitting system for digitally modulated signal including:
  a transmission signal input terminal;
  digital modulation processing means connected to said transmission signal input terminal; and
  a transmission signal output terminal coupled to said digital modulation processing means;

(c) a card-type case having a protrusion to meet an increased circuit requirement, said receiving system and said transmitting system being packed in said card-type case;

wherein said output terminal, said data input terminal, said power input terminal and said transmission signal input terminal are arranged on a lateral side of said case, and wherein said signal input terminal and said transmission signal output terminal are coupled to a duplexer connected to a single signal input/output terminal so as to prevent an output signal from said digital modulation processing means from circumventing into the receiving system.

14. A card-type electronic device according to claim 13, wherein said demodulator is arranged at a position adjacent to said output terminal.

15. A card-type electronic device according to claim 13, further comprising an A/D converter inserted between said demodulator and said output terminal, said A/D converter being arranged at a position adjacent to said demodulator and said output terminal.

16. A card-type electronic device according to claim 13, wherein a replaceable antenna is mounted on a single signal input/output terminal.

17. A card-type electronic device according to claim 13, wherein said antenna is a bar antenna arranged substantially in parallel to a longitudinal side of said case.

18. A card-type electronic device according to claim 13, further comprising an audio multiplexing circuit inserted between said demodulator and said output terminal.

* * * * *